(12) United States Patent
Toh et al.

(10) Patent No.: US 9,734,882 B2
(45) Date of Patent: Aug. 15, 2017

(54) MAGNETIC MEMORY CELLS WITH HIGH WRITE CURRENT AND READ STABILITY

(71) Applicant: GLOBALFOUNDRIES Singapore Pte. Ltd., Singapore (SG)

(72) Inventors: Eng Huat Toh, Singapore (SG); Vinayak Bharat Naik, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/012,813

(22) Filed: Feb. 1, 2016

(65) Prior Publication Data

US 2016/0225819 A1 Aug. 4, 2016

Related U.S. Application Data

(60) Provisional application No. 62/110,606, filed on Feb. 2, 2015.

(51) Int. Cl.
*H01L 27/22* (2006.01)
*H01L 43/12* (2006.01)
(Continued)

(52) U.S. Cl.
CPC .......... *G11C 11/165* (2013.01); *G11C 11/161* (2013.01); *H01L 27/228* (2013.01);
(Continued)

(58) Field of Classification Search
CPC .................................................... G11C 11/161
See application file for complete search history.

(56) References Cited

U.S. PATENT DOCUMENTS 7,786,756 B1 * 8/2010 Svilan ............... G06F 1/305
326/33
8,877,619 B1 * 11/2014 Thompson ...... H01L 21/823412
438/308

(Continued)

OTHER PUBLICATIONS

Hai Li and Yiran Chen, Chapter 3.6: Design Techniques of STT-RAM, Nonvolatile Memory Design: Magnetic, Resistive, and Phase Changing, 2011, pp. 84-86, CRC Press Taylor & Francis Group, Boca Raton, FL.

*Primary Examiner* — Anthan Tran
*Assistant Examiner* — Mushfique Siddique
(74) *Attorney, Agent, or Firm* — Horizon IP Pte. Ltd.

(57) ABSTRACT

Memory cells and methods of forming thereof are disclosed. The memory cell includes a substrate and first and second select transistors. The first select transistor serves as a write selector and the second select transistor serves as a read selector. The gate of first select transistor is coupled to a write wordline (WL_w) and the gate of the second select transistor is coupled to a read/write wordline (WL_r/w). The source regions of the first and second select transistors are coupled to a source line (SL). A body well is disposed in the substrate. The body well serves as a body of the first and second select transistors. A back bias is applied to the body of the select transistors. A storage element which includes a magnetic tunnel junction (MTJ) element is coupled with a bitline (BL) and the first and the second select transistors.

20 Claims, 27 Drawing Sheets

(51) Int. Cl.
*H01L 43/08* (2006.01)
*G11C 11/16* (2006.01)
*H01L 43/02* (2006.01)
*G11C 11/15* (2006.01)

(52) U.S. Cl.
CPC .............. *H01L 43/02* (2013.01); *G11C 11/15* (2013.01); *G11C 11/16* (2013.01)

(56) References Cited

U.S. PATENT DOCUMENTS

| | | | | |
|---|---|---|---|---|
| 2006/0067112 A1* | 3/2006 | Ferrant | .................... | G11C 8/14 365/158 |
| 2006/0077737 A1* | 4/2006 | Ooishi | .................... | G11C 11/16 365/203 |
| 2008/0002481 A1* | 1/2008 | Gogl | ........................ | G11C 5/02 365/189.06 |
| 2008/0219043 A1* | 9/2008 | Yoon | ........................ | G11C 11/16 365/158 |
| 2010/0238711 A1* | 9/2010 | Asao | ........................ | G11C 8/14 365/148 |
| 2010/0238718 A1* | 9/2010 | Asao | ........................ | G11C 11/16 365/158 |
| 2012/0218805 A1* | 8/2012 | Kim | ........................ | H01L 43/12 365/63 |
| 2012/0275212 A1* | 11/2012 | Jung | ........................ | G11C 7/06 365/148 |
| 2015/0041900 A1* | 2/2015 | Weber | .................... | H01L 27/092 257/351 |
| 2015/0109851 A1* | 4/2015 | Higo | .................... | G11C 13/003 365/148 |
| 2015/0131370 A1* | 5/2015 | Zhou | .................... | G11C 11/1675 365/158 |
| 2016/0064452 A1* | 3/2016 | Ueda | .................... | H01L 27/228 365/148 |
| 2016/0196861 A1* | 7/2016 | Sugiyama | ............... | H01L 43/08 365/51 |
| 2016/0225423 A1* | 8/2016 | Naik | ........................ | H01L 43/08 |
| 2016/0225429 A1* | 8/2016 | Toh | ........................ | G11C 11/1675 |
| 2016/0225818 A1* | 8/2016 | Toh | ........................ | G11C 11/1675 |
| 2016/0225819 A1* | 8/2016 | Toh | ........................ | G11C 11/165 |
| 2016/0233333 A1* | 8/2016 | Toh | ........................ | H01L 27/226 |
| 2016/0322090 A1* | 11/2016 | Chan | .................... | G11C 11/161 |

* cited by examiner

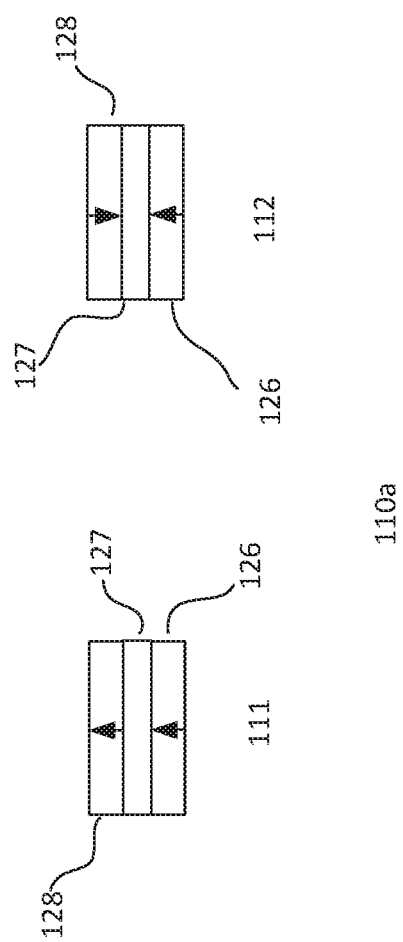

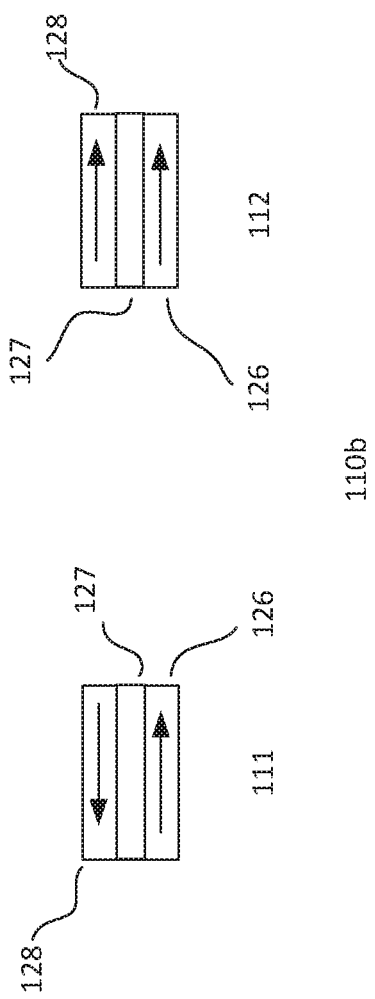

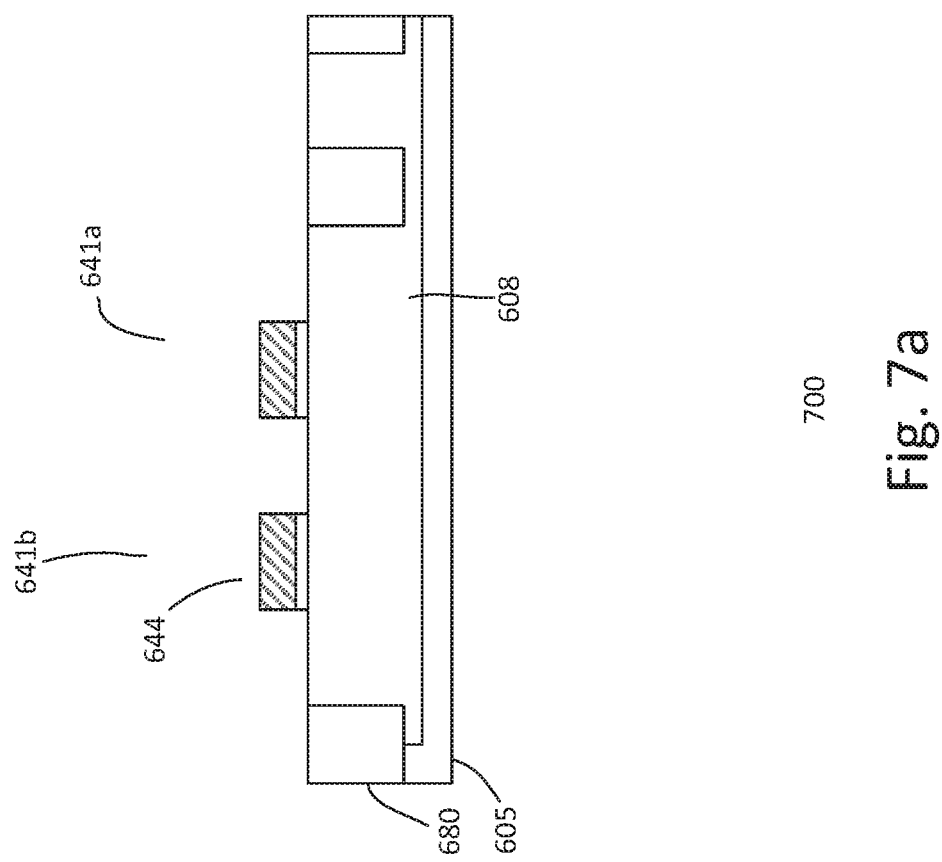

MAGNETIC MEMORY CELLS WITH HIGH WRITE CURRENT AND READ STABILITY

CROSS-REFERENCE TO RELATED APPLICATION

This application claims the benefit of U.S. Provisional Application Ser. No. 62/110,606, filed on Feb. 2, 2015, which is herein incorporated by reference in its entirety for all purposes.

BACKGROUND

A magnetic memory cell stores information by changing electrical resistance of a magnetic tunnel junction (MTJ) element. The MTJ element typically includes a fixed (pinned) magnetic layer and a free magnetic layer. The fixed (pinned) magnetic layer and the free magnetic layer are laminated such that a tunnel barrier film is formed between the two layers. Magnetic orientation of the free layer flips by a direction or an opposite direction of electric currents exceeding a critical select current. The electrical resistance of the MTJ element changes corresponding to that of the magnetic orientation of the free layer relating to the fixed (pinned) magnetic layer, which may be in either a parallel state or an anti-parallel state.

Magnetic memory cells require high write current to improve write speed for programming. However, high write current also results in a higher read current. High read current increases read disturb. For example, if the read current exceeds the critical switching current of MTJ ($I_{C0}$), the read current could cause the free layer to switch directions, resulting in a read error.

From the foregoing discussion, it is desirable to provide magnetic memory cells with high write speed and read stability.

SUMMARY

Embodiments of the present disclosure generally relate to memory devices and methods for forming a memory device. In one embodiment, a memory cell is disclosed. The memory cell includes a substrate defined with a memory cell region and a cell selector unit disposed on the substrate. The cell selector unit includes a first select transistor having a first gate coupled to a first word line (WL) and first and second source/drain (S/D) regions, and a second select transistor having a second gate coupled to a second WL and first and second S/D regions. The first select transistor serves as a write selector and the second select transistor serves as a read selector. The first WL is a write wordline (WL_w) and the second WL is a read/write wordline (WL_r/w). The second S/D regions of the first and second select transistors are coupled to a source line (SL). A body well is disposed in the substrate. The body well serves as a body of the first and second select transistors. A back bias is applied to the body of the select transistors. A storage element which includes a magnetic tunnel junction (MTJ) element is coupled with a bitline (BL) and the first and the second select transistors.

In another embodiment, a memory cell is presented. The memory cell includes a substrate defined with a memory cell region and a cell selector unit disposed on the substrate. The cell selector unit includes a first select transistor having a first gate coupled to a first word line (WL) and first and second source/drain (S/D) regions, and a second select transistor having a second gate coupled to a second WL and first and second S/D regions. The first select transistor serves as a write selector and the second select transistor serves as a read selector. The first select transistor is a low threshold voltage (LVT) transistor and the second select transistor is a high threshold voltage (HVT) or regular threshold voltage transistor (RVT). The first WL is a write wordline (WL_w) and the second WL is a read/write wordline (WL_r/w). The second S/D regions of the first and second select transistors are coupled to a source line (SL). A storage element which includes a magnetic tunnel junction (MTJ) element is coupled with a bitline (BL) and the first and the second select transistors.

In yet another embodiment, a method of operating a memory cell is disclosed. The method includes providing a memory cell as described above. The method further includes performing a read operation or write operation with the memory cell. When a write operation is performed, the WL_w and the WL_r/w are activated such that a write path is formed through both the first and second select transistors. When a read operation is performed, the WL_w is inactive and the WL_r/w is activated such that a read path is formed through the second select transistor.

In another embodiment, a method of forming a memory cell is presented. The method includes providing a substrate defined with a memory cell region and forming a cell selector unit on the substrate. A first select transistor having a first gate coupled to a first word line (WL) and first and second source/drain (S/D) regions is formed. A second select transistor having a second gate coupled to a second WL and first and second S/D regions is formed. The first select transistor serves as a write selector and the second select transistor serves as a read selector. The first WL is a write wordline (WL_w) and the second WL is a read/write wordline (WL_r/w). The second S/D regions of the first and second select transistors are coupled to a source line (SL). A body well is formed in the substrate. The body well serves as a body of the first and second select transistors. A back bias is applied to the body of the select transistors. A storage element which includes a magnetic tunnel junction (MTJ) element is formed and is coupled with a bitline (BL) and the first and the second selectors.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 1a-1b show diagrams of parallel and anti-parallel states of magnetic tunneling junction (MTJ) elements;

FIGS. 6a-6m show cross-sectional views of an embodiment of a process for forming a device with a memory cell; and FIGS. 7a-7d show cross-sectional views of another embodiment of a process for forming a device with a memory cell.

DETAILED DESCRIPTION

Figure 2A:
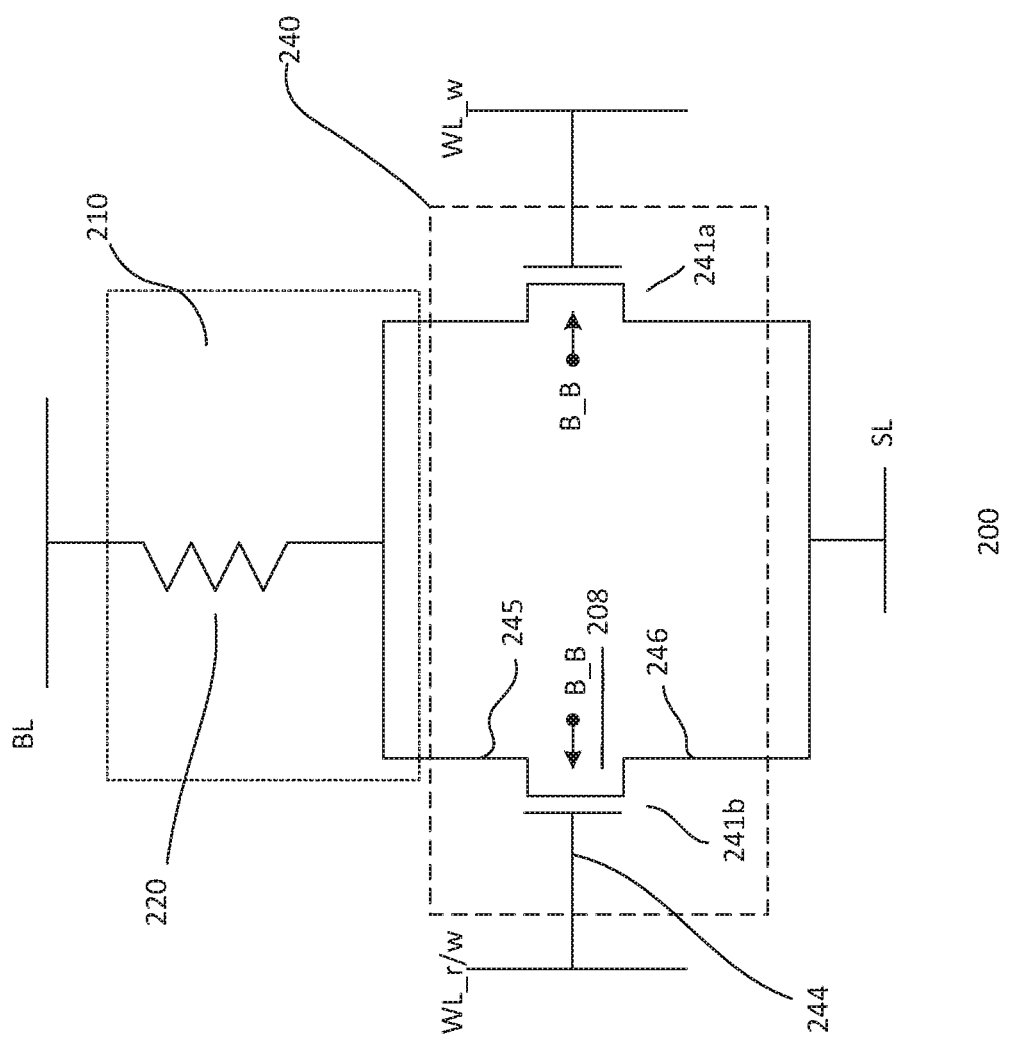
FIGS. 2a-2b show schematic diagrams of various embodiments of memory cells.

Embodiments of the present disclosure generally relate to memory cells. In one embodiment, the memory cells are magnetic resistive memory cells, such as magnetic random access memory (MRAM). Magnetic resistive memory cells include magnetic tunneling junction (MTJ) elements. Other suitable types of resistive memory cells may also be useful. The memory cells are configured to produce fast write time with read stability. The memory cells can be incorporated into or used with, for example, electronic products such as mobile phones, smart cards, mass storage, enterprise storage and industrial and automotive products.

FIG. 1a shows a simplified cross-sectional view of an embodiment of a MTJ element 110a. As shown, the magnetization or magnetic orientations of the magnetic element are configured to be in a perpendicular or vertical direction. Perpendicular direction, for example, refers to a direction which is perpendicular to a substrate surface. A MTJ element includes a magnetically fixed (pinned) layer 126, a tunneling barrier layer 127 and a magnetically free layer 128. The magnetic orientation of the fixed layer is fixed while the magnetic orientation of the free layer may be programmed to be in a first or same direction as the fixed layer or in a second or opposite direction as the fixed layer. For example, as shown by structure 111, the magnetic direction of the free layer is programmed to be in a first or parallel direction as the fixed layer. The corresponding MTJ electrical resistance between the free layer 128 and the fixed layer 126 is denoted as $R_P$. Structure 112 illustrates that the magnetization of the free layer is programmed to be in a second or an anti-parallel direction as the fixed layer. The corresponding MTJ electrical resistance between the free layer 128 and the fixed layer 126 is denoted as $R_{AP}$. The resistance $R_{AP}$ is higher than the resistance $R_P$. By way of example, the free layer and the fixed or reference layer may be CoFeB or CoFe based composite material and the tunneling barrier layer may be MgO or $Al_2O_3$. The MTJ stack may include other layers as well. Other suitable materials for the MTJ stack may also be useful.

FIG. 1b shows magnetic orientations in the magnetic layers of a MTJ element 110b in a horizontal direction. Horizontal direction, for example, refers to a direction which is parallel to the surface of a substrate surface or in-plane with the magnetic layers. As shown in FIG. 1b, the MTJ element 110b includes a fixed (pinned) layer 126, a barrier layer 127 and a free layer 128. When the MTJ element 110b is in a magnetic anti-parallel state, magnetic orientations of the free layer 128 and the fixed layer 126 are in opposite directions, as shown by structure 111. The corresponding MTJ electrical resistance between the free layer 128 and the fixed layer 126 is denoted as $R_{AP}$. When the MTJ element 110b is in a magnetic parallel state, magnetic orientations of the free layer 128 and the fixed layer 126 are in the same direction as shown by structure 112. The corresponding MTJ electrical resistance between the free layer 128 and the fixed layer 126 is denoted as $R_P$.

As shown in FIGS. 1a-1b, the MTJ stacks are bottom pinned stacks. For example, in a bottom pinned stack, the fixed layer is disposed below the free layer. In other embodiments, the MTJ stacks may be top pinned MTJ stacks. For example, the fixed layer may be disposed above the free layer.

FIG. 2a shows a schematic diagram of an embodiment of a memory cell 200. The memory cell is a non-volatile memory cell. For example, the memory cell may be a magnetic memory cell. In one embodiment, the memory cell is a Spin Torque Transfer-Magnetic Random Access Memory (STT-MRAM) cell. Other suitable types of memory cells may also be useful. The memory cell includes a storage unit 210 and a cell selector unit 240. The storage unit is coupled to the cell selector unit. The storage unit 210, in one embodiment, includes a storage element 220. The storage element, for example, may be a resistive storage element. In one embodiment, the storage element is a magnetic resistive memory storage element, such as a MTJ storage element. The MTJ element may include MTJ elements such as those described in FIGS. 1a-1b. Other suitable types of MTJ or resistive storage elements may also be useful.

In one embodiment, the MTJ element is a bottom pinned perpendicular MTJ element. Other types of MTJ elements, such as horizontal or top pinned MTJ elements may also be useful. The top of the MTJ stack is coupled to a bitline BL while the bottom of the MTJ stack is coupled to the selector unit. In some cases, the MTJ element may include top and/or bottom electrodes (not shown). For example, the top electrode is disposed over the top of the MTJ element and the bottom electrode is disposed below the MTJ stack. The electrodes may be Ta electrodes. Other types of electrodes may also be useful. In such cases, the top electrode is coupled to a bitline BL of the memory cell while the bottom electrode is coupled to the selector unit.

As for the cell selector unit 240, it includes first and second selectors or selector subunits 241a-241b. The first selector subunit 241a, for example, may be a write selector and the second selector subunit 241b may be a read selector. In one embodiment, the second selector subunit 241b is a read/write selector unit. A selector subunit includes a select transistor. For example, the first selector subunit includes a first select transistor and the second selector subunit includes a second select transistor. A select transistor of a subunit is, for example, a metal oxide semiconductor (MOS) transistor. In one embodiment, the select transistor is an n-type MOS transistor. Providing a p-type MOS transistor as a select transistor may also be useful.

A select transistor, as shown, includes first and second source/drain (S/D) terminals 245 and 246, a gate or control terminal 244 and a body 208. The body of the transistor, for example, is a doped well having the opposite polarity type as the transistor type. For example, an n-type transistor has a p-type body. In one embodiment, a back bias B_B is applied to the body of the select transistor. The S/D terminals 245 and 246 are formed by, for example, heavily doped regions having the same polarity type dopants as the transistor type. For example, the S/D terminals are heavily n-doped regions for an n-type transistor. The first S/D terminal 245 may be referred to as a drain terminal and the second S/D terminal 246 may be referred to as a source terminal. As shown, the drain terminals of the select transistors are commonly coupled to the MTJ element. For example, the drain terminals are coupled to the bottom electrode of the MTJ element. The source terminals of the select transistors are commonly coupled to a source line SL of the memory cell.

In one embodiment, a write wordline (WL_w) is coupled to the gate terminal of the write selector 241a and a read wordline is coupled to the gate terminal of the read selector 241b. During a write operation, the WL_w is activated, causing the write selector to couple the storage unit to the SL, creating the write path through the first select transistor. During a read operation, the read wordline is activated while WL_w is inactive. This forms a read path through the second select transistor to the SL.

In one embodiment, the read wordline can be activated during a write operation as well. For example, the gate of the second transistor 241b is coupled to a read/write wordline (WL_r/w). As described, the write path is formed through both the first and second select transistors. Providing a write current by both transistors increases the write current to program the MTJ element. Depending on whether the write is a "1" or a "0", the write current is from the BL to the SL through both transistors or from SL to the BL through both transistors. As for the read path, it is formed only through the second transistor. This reduces the read current to the MTJ stack, resulting in more stable read operations. Furthermore, the back bias applied to the transistor body offers various advantages. For example, a forward back bias (i.e. positive voltage for NFET) applied to the transistor body increases the write current and a reverse back bias (i.e. negative voltage for NFET) applied to the transistor body reduces the read current.

Table 1 below shows exemplary signals or bias conditions applied to the memory cell of FIG. 1a for read and write operations.

As for the cell selector unit 240, it includes first and second selectors or selector subunits 241a-241b. The first selector 241a, for example, may be a write selector and the second selector 241b may be a read or a read/write selector. A selector includes a select transistor, such as an n-type MOS transistor. Providing a p-type MOS transistor may also be useful.

A select transistor includes first and second source/drain (S/D) terminals 245 and 246, a gate or control terminal 244 and a body 208. The first S/D terminal 245 may be referred to as a drain terminal and the second S/D terminal 246 may be referred to as a source terminal. The drain terminals of the select transistors are commonly coupled to the MTJ element; the source terminals of the select transistors are commonly coupled to a source line SL of the memory cell.

In one embodiment, a WL_w is coupled to the gate terminal of the first transistor and a WL_r/w is coupled to the second transistor. In one embodiment, the first transistor 241a is a transistor with a low threshold voltage (LVT). For example, the LVT is about 0.1-0.3V. As for the second transistor 241b, it is a high threshold voltage (HVT) transistor or a regular voltage threshold (RVT) transistor. HVT or RVT is higher than LVT. For example, HVT may be about 0.4-0.6V and RVT may be about 0.2-0.4V. Other suitable voltage values may also be useful depending on, for example, technology node. Providing a HVT or RVT transistor for read operations decreases read current, improving read stability.

TABLE 1

| | signal (V) | | | | | | | | | |
|---|---|---|---|---|---|---|---|---|---|---|
| | BL | | SL | | WL_w | | WL_r/w | | B_B | |
| operation | Sel | Unsel | Sel | Unsel | Sel | Unsel | Sel | Unsel | Sel | Unsel |
| Read | Med | Low | Low | Low | Low | Low | High | Low | Neg | Neg |
| Write "1" | High | Low | Low | Low | High | Low | High | Low | Pos | Pos |
| Write "0" | Low | Low | High | Low | High | Low | High | Low | Pos | Pos |

The voltage values for a logic medium ("Med") is about 0.1-0.2V, a logic "High" is 1.0V and a logic "Low" is 0V. In the case of a back bias (B_B), a logic "Neg" is less than 0 to −2V while a logic "POS" is greater than 0 to 0.6V for a silicon substrate or 0 to 2.0V for a fully depleted silicon-on-insulator (FDSOI) substrate. The voltage values are exemplary and may change depending on, for example, the technology node. In addition, the voltage and logic values as presented based on a memory cell with n-type MOS transistors and for MTJ stack with a bottom-pinned structure, i.e. free layer or storage layer is disposed on top of the tunnel barrier. The values may change for other types of select transistors.

Figure 2B:
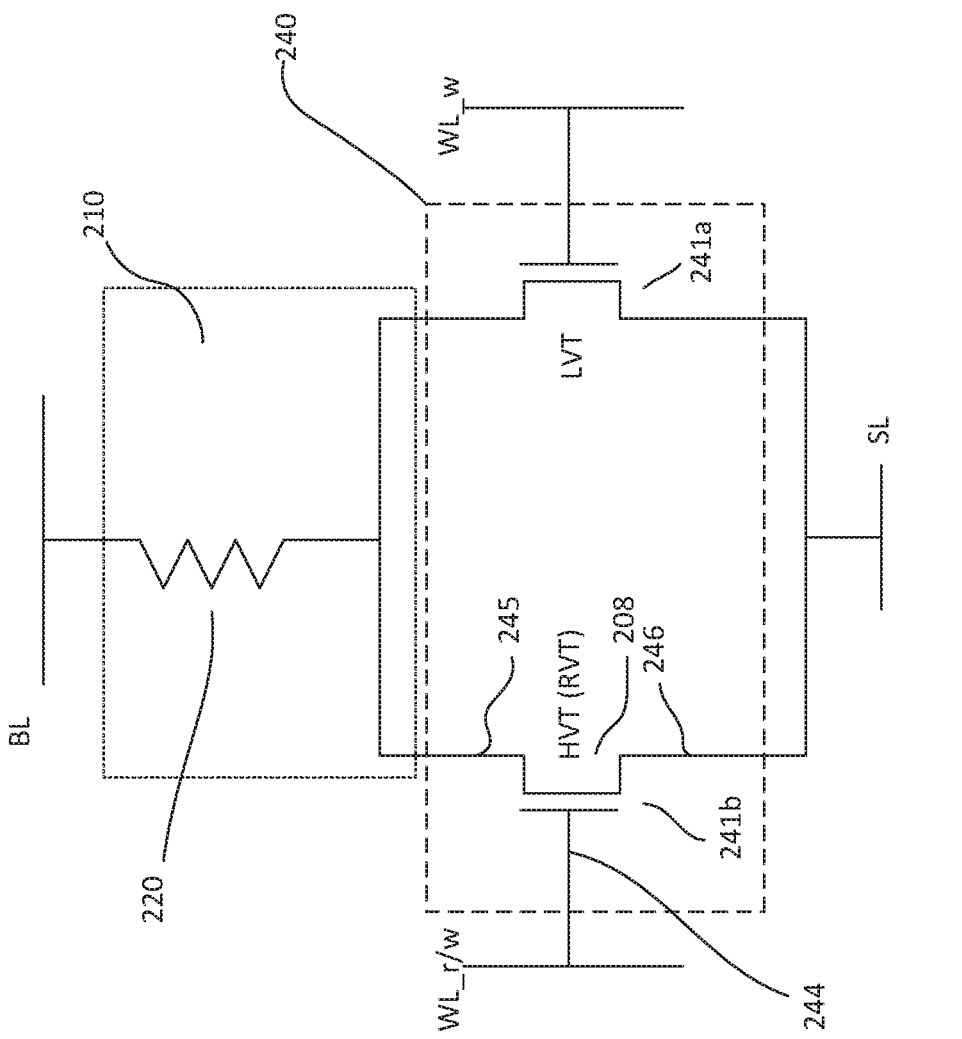

FIG. 2b shows a schematic diagram of another embodiments of a memory cell 200. The memory cell is a non-volatile memory cell, such as a magnetic memory cell. For example, the memory cell may be a STT-MRAM cell. The memory cell is similar to the memory cell described in FIG. 2a. Common elements may not be described or described in detail.

The memory cell includes a storage unit 210 and a cell selector unit 240. The storage unit is coupled to the cell selector unit. The storage unit 210, in one embodiment, includes a storage element 220, such as a MTJ storage element. The top of the MTJ stack is coupled to a bitline BL while the bottom of the MTJ stack is coupled to the selector unit. The MTJ stack may include top and/or bottom electrodes (not shown).

The operating biases for the memory cell is similar to that provided in Table 1 above, except that the bodies of the select transistors are not back biased. In some applications, the memory cell of FIG. 2b may be provided with a back bias to the bodies of the select transistors. In such case, a forward back bias (i.e. positive voltage for NFET) applied to the transistor body increases the write current and a reverse back bias (i.e. negative voltage for NFET) applied to the transistor body reduces the read current.

Figure 3A:
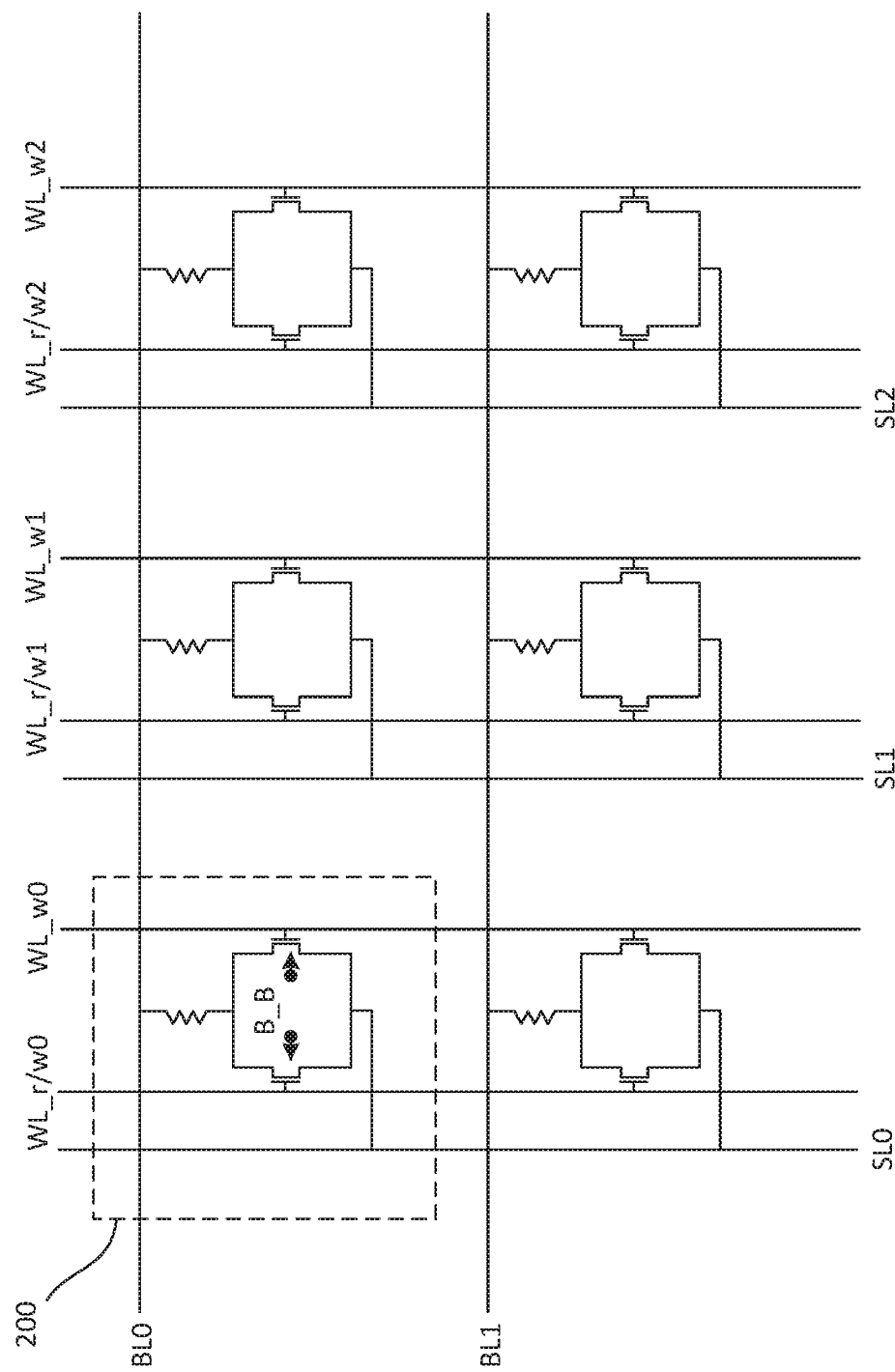
FIGS. 3a-3b illustrate various embodiments of a memory array.

FIG. 3a shows a schematic diagram of an embodiment of a memory array 300. The array includes a plurality of interconnected memory cells 200. The memory cells may be similar to the memory cell described in FIG. 2a. For example, the memory cells are MRAM cells, such as STT-MRAM cells. Other types of memory cells may also be useful. Common elements may not be described or described in detail. In one embodiment, the memory cells include select transistors having bodies which are back biased.

As shown, the array includes six memory cells arranged in a 3×2 array. For example, the array is arranged to form three rows and two columns of memory cells. Memory cells of a row are interconnected by WL_w/r, WL_w, and SL lines (WL_r/w0, WL_w0 and SL0; WL_r/w1, WL_w1 and SL1; or WL_r/w2, WL_w2, SL2) while memory cells of a column are interconnected by a BL line (BL0; or BL1).

Figure 3B:
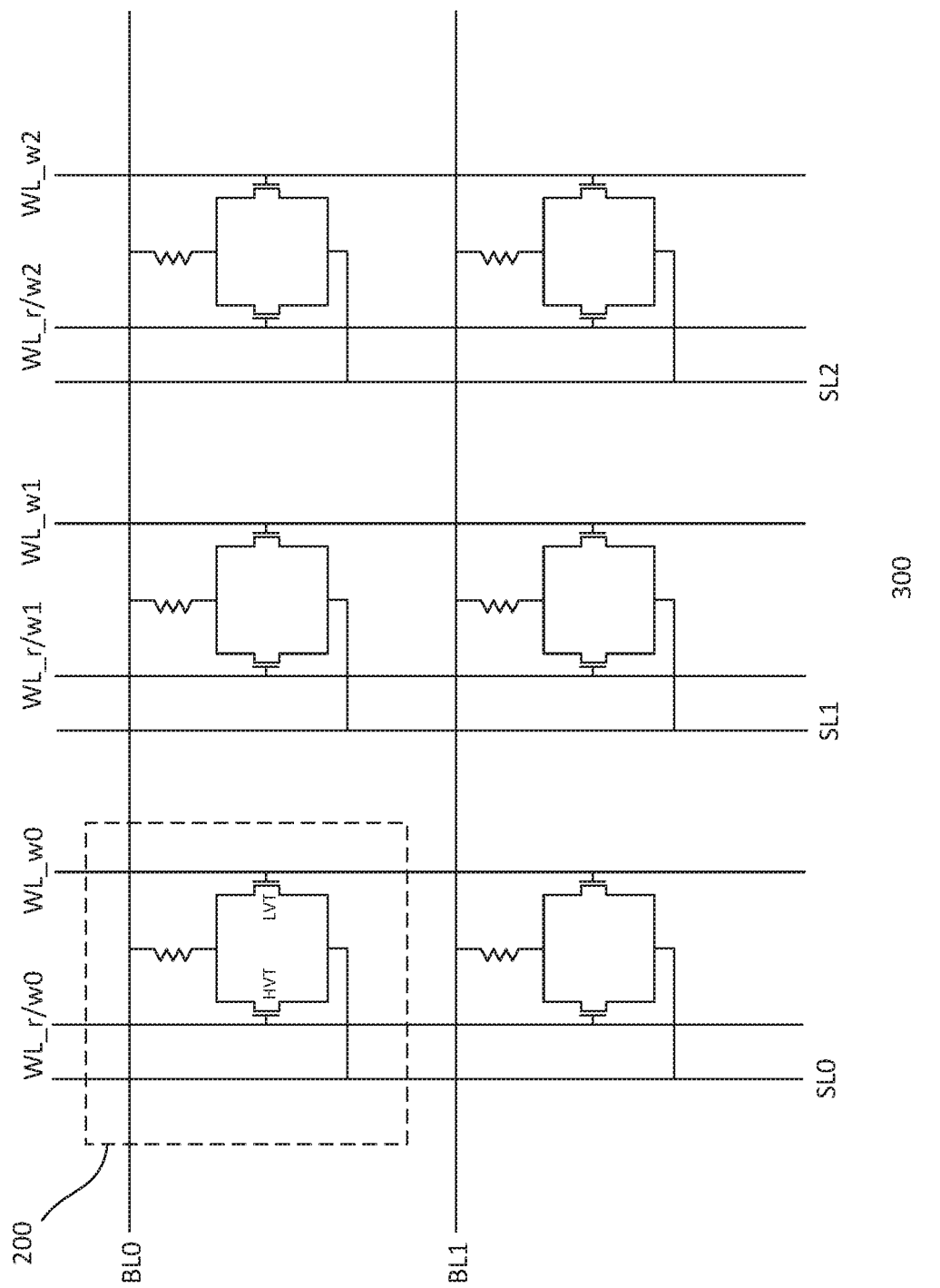

FIG. 3b shows a schematic diagram of another embodiment of a memory array 300. The array includes a plurality of interconnected memory cells 200. The memory cells may be similar to the memory cell described in FIG. 2b. For example, the memory cells are MRAM cells, such as STT-MRAM cells. Other types of memory cells may also be useful. Common elements may not be described or described in detail. In one embodiment, the first select transistor is a LVT transistor and the second select transistor is a HVT transistor. Providing a memory cell with both back biased transistor bodies as well as LVT as the first select transistor and HVT as the second select transistor may also be useful.

As shown, the array includes six memory cells arranged in a 3×2 array. For example, the array is arranged to form three rows and two columns of memory cells. Memory cells of a row are interconnected by WL_w/r, WL_w, SL lines (WL_r/w0, WL_w0 and SL0; WL_r/w1, WL_w1 and SL1; or WL_r/w2, WL_w2, SL2) while memory cells of a column are interconnected by a BL line (BL0; or BL1).

Figure 4A:
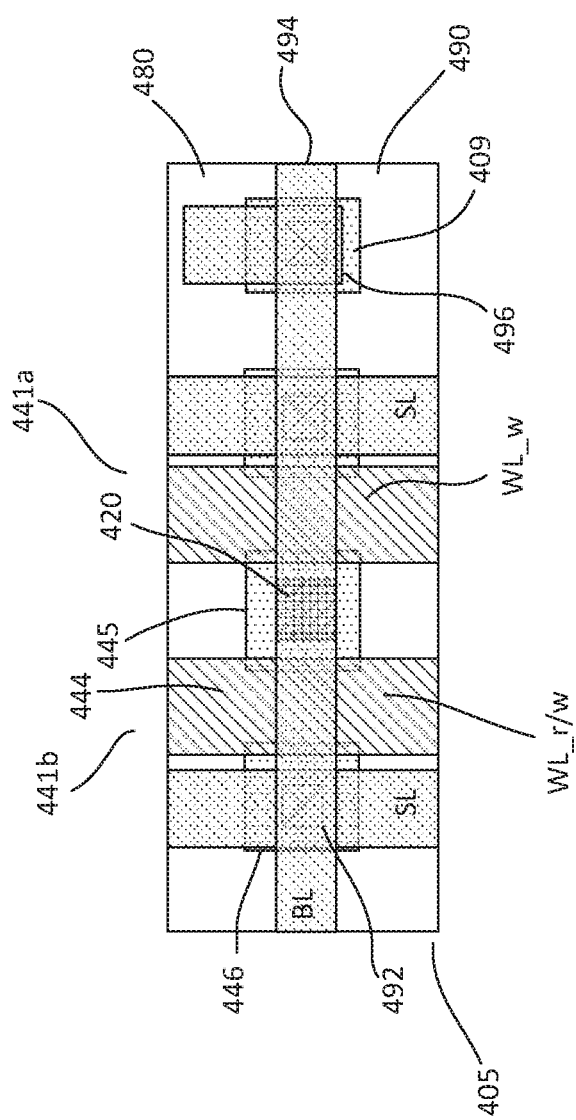
FIGS. 4a-4b show top and cross-sectional views of an embodiment of a memory cell.
Figure 4B:
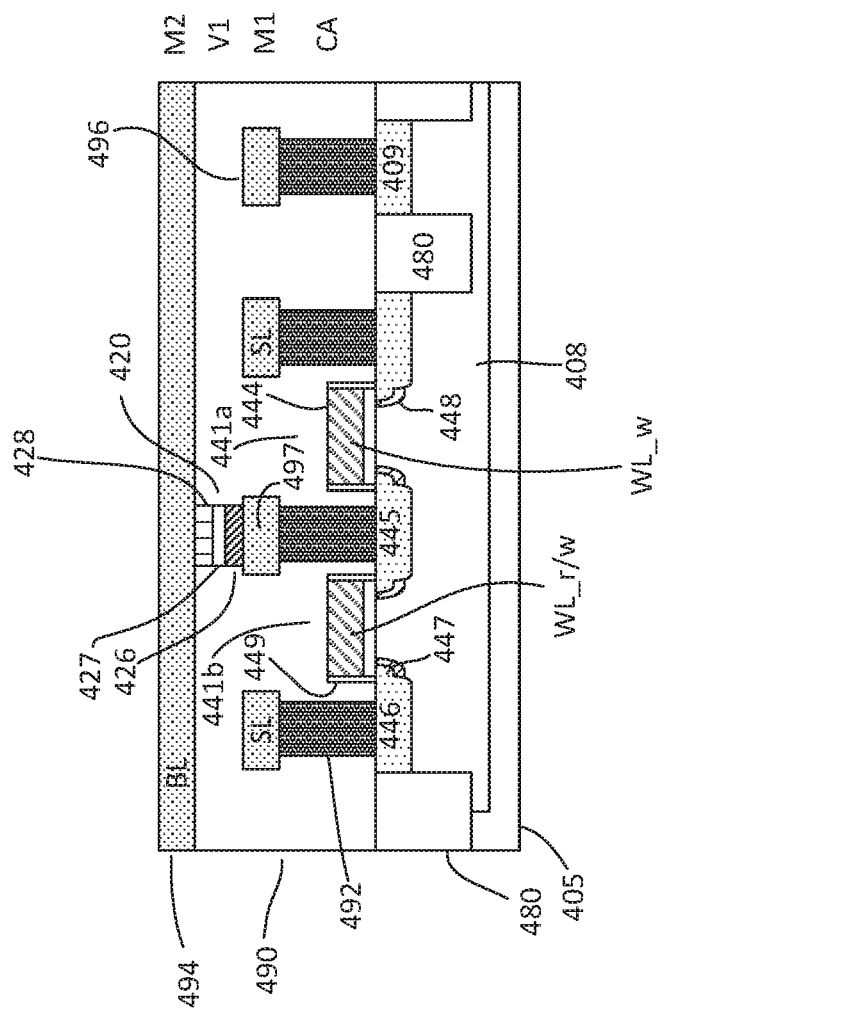

FIGS. 4a-4b show top and cross-sectional views of an embodiment of a device 400. The device, as shown, includes a memory cell. The memory cell, for example, may be a NVM memory cell. The memory cell, in one embodiment, is a magnetoresistive NVM cell, such as a STT-MRAM cell. The memory cell, for example, is similar to that described in FIG. 2a. Common elements may not be described or described in detail.

The memory cell is disposed on a substrate 405. For example, the memory cell is disposed in a cell region of the substrate. The cell region may be part of an array region. For example, the array region may include a plurality of cell regions. The substrate may include other types of device regions (not shown), such as high voltage (HV) as well as logic regions, including low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, includes silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Isolation regions 480 may be provided. In one embodiment, the isolation regions are shallow trench isolation (STI) regions. Other types of isolation regions may also be useful. The isolation regions are provided to isolate device regions from other regions. In one embodiment, isolation regions may be provided to isolate memory cells from each other. For example, a memory cell may be formed in a cell region which is isolated from other cell regions by isolation regions. Other suitable configurations of isolation regions may also be useful.

A cell selector unit is provided in the cell region. The cell selector unit includes first and second selectors 441a-441b. The first selector, for example, may be a write selector and the second selector is a read/write selector. The selectors, in one embodiment, include transistors. For example, the transistors of the selectors are metal oxide semiconductor (MOS) transistors. In one embodiment, the MOS transistors are n-type MOS transistors. Other types of cell selectors may also be useful.

The cell region includes a device well or body well 408 which serves as a body of the transistors. For example, the cell region includes a body or device well for transistors of the selectors. The device well may be a continuous well for the entire memory array. The body well may be doped with second polarity type dopants for first polarity type select transistors. The body well, in one embodiment, is a p-type doped well for n-type transistors. The device well may be lightly or intermediately doped with second polarity type dopants. For example, the device well may have a dopant concentration of about 1E16 to 1E19/cm$^3$. Other suitable dopant concentrations may also be useful.

A transistor, as shown, includes first and second source/drain (S/D) regions 445 and 446. A gate 444 is disposed on the substrate between the S/D regions. A gate, for example, may include a gate electrode over a gate dielectric. The gate electrode may be polysilicon while the gate dielectric may be silicon oxide. Other suitable types of gate electrode and gate dielectric materials may also be useful. For example, a gate may be a metal gate with a metal gate electrode and a high k gate dielectric. A gate, for example, may be a gate conductor along a first or word line (WL) direction. The gate conductor forms a common gate for a row of memory cells.

As for the S/D regions, they are heavily doped regions with first polarity type dopants. For example, the S/D regions are heavily doped n-type regions for forming n-type transistors. Providing S/D regions with p-type dopants may also be useful. The S/D regions may include lightly doped (LD) extension regions. The gate may include dielectric sidewall spacers 449. The spacers, for example, facilitate in forming the lightly doped (LD) extension regions 447 and heavily doped S/D regions. The LD extension regions, for example, are lightly doped regions extending slightly under the gate. In one embodiment, halo regions 448 are provided for the S/D regions. The halo regions are second polarity type doped regions which extend beyond the LD extension regions.

In one embodiment, the first and second transistors share a common drain region 445. The gates of the transistors serve as wordlines. In one embodiment, the first gate of the first transistor 441a serves as a WL_w and the second gate of the second transistor 441b serves as a WL_r/w.

As shown, a well contact 409 is disposed in the well 408. The well contact is a second polarity type heavily doped region. For example, the well contact is a heavily doped p-type region for an n-type device. The well contact provides a back bias voltage to the device well to bias the body of the transistors of the selectors.

Disposed over the transistors is a dielectric layer 490. The dielectric layer serves as a backend dielectric layer. The backend dielectric layer may include one or more interlevel dielectric (ILD) layers. An ILD layer includes a metal level and a contact level. The metal level includes conductors or metal lines while the contact level includes contacts. The conductors and contacts may be formed of a metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE), may also be employed to form metal lines.

As discussed, the backend dielectric layer may include a plurality of ILD levels. For example, x number of ILD levels may be provided. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. As shown, the dielectric layer includes ILD levels up to M2. The dielectric layer may include additional ILD levels (not shown). The number of levels may depend on design requirements. For example, the dielectric layer may include 6 ILD levels. For example, the dielectric layer may include up to M6. Other suitable number of ILD levels may also be useful.

For the first contact level, it may be referred to as a CA or a pre-metal dielectric (PMD) level. The first metal level may be referred to as M1. For the first ILD level, contacts and metal lines may be formed by separate single damascene processes. Contacts in the PMD level may be tungsten contacts while conductors or metal lines in M1 may be formed of copper or copper alloy. For upper ILD levels, metal lines and contacts may be formed by dual damascene techniques. Dual damascene processes may employ copper or copper alloys for contacts and conductive lines. Other configurations or techniques for forming lines and contacts of the ILD levels may also be useful.

A dielectric liner may be disposed between ILD levels. The dielectric liner, for example, serves as an etch stop layer. The dielectric liner may be formed of a low k dielectric. For example, the dielectric liner may be nBLOK. Other types of dielectric materials for the dielectric liner may also be useful.

As shown, contacts 492 are disposed in the CA level of the backend dielectric layer. The contacts, for example, are in communication with the drain and source regions 445 and 446 of the select transistors and the well contact 409. Conductive lines 494 are disposed in the first metal or M1 level above the CA level. In one embodiment, SLs are coupled to the source region of the select transistors. For example, a first SL is coupled to the source region of the first select transistor and a second SL is coupled to the source region of the second select transistor. The SLs are connected to the sources via contacts in the CA level. In addition, an interconnect pad 496 is disposed in M1 which is coupled to the well contact 409 via a contact 492 in the CA level. A storage interconnect pad 497 is also provided in M1 which is coupled to the drain 445 of the transistors.

A storage element 420 may be disposed in the storage dielectric layer above the interconnects connecting to the various transistors of the select unit. For example, the storage elements may be disposed over the first metal level. The storage dielectric layer may be a via level V1, as shown above M1. Providing the storage dielectric layer in other upper levels may also be useful. The storage element may be provided in a storage dielectric level.

The storage element, in one embodiment, is a MTJ element, as described in FIGS. 1a-1b. Other types of storage or resistive storage elements may also be useful. For example, the MTJ element includes a tunneling barrier layer 427 disposed between fixed and free layers 426 and 428. As shown, the MTJ element is a bottom pinned MTJ element. In one embodiment, the MTJ element is a bottom pinned perpendicular MTJ element. The MTJ element may include top and bottom electrodes (not shown), such as Ta electrodes. Other types or configurations of the storage elements may also be useful.

Above the storage dielectric layer is a metal layer of an ILD level. For example, the metal layer is M2. Other metal layers may also be useful. The metal layer includes metal lines disposed in a dielectric layer. The metal line and top of the dielectric layer have coplanar top surfaces. In one embodiment, a bit line (BL) is coupled to the storage element.

Although as described, the various lines and storage element are disposed in specified dielectric levels of the backend dielectric levels, other configurations may also be useful. For example, they may be disposed in other or additional metal levels. For example, the storage element may be provided in an upper via level, such as between M5 and M6. In such case, the BL may be disposed in metal level M6. The BL may also be disposed in other suitable metal level. Furthermore, the device may include other device regions and components.

Further, in other embodiments, the device may be modified to include a fully depleted silicon-on-insulator (FDSOI) substrate. The SOI substrate includes a surface crystalline layer separated from a bulk crystalline by a buried oxide (BOX) layer. In such case, the back bias may be provided through the BOX layer to increase the write current or to reduce the read current. A body contact may be disposed through the BOX to connect to the N-type region of the bulk crystalline for back-biasing. For example, a forward back bias (i.e. positive voltage for NFET) applied to the N-type region of the bulk crystalline increases the write current and a reverse back bias (i.e. negative voltage for NFET) applied to the N-type region of the bulk crystalline reduces the read current.

Figure 5A:
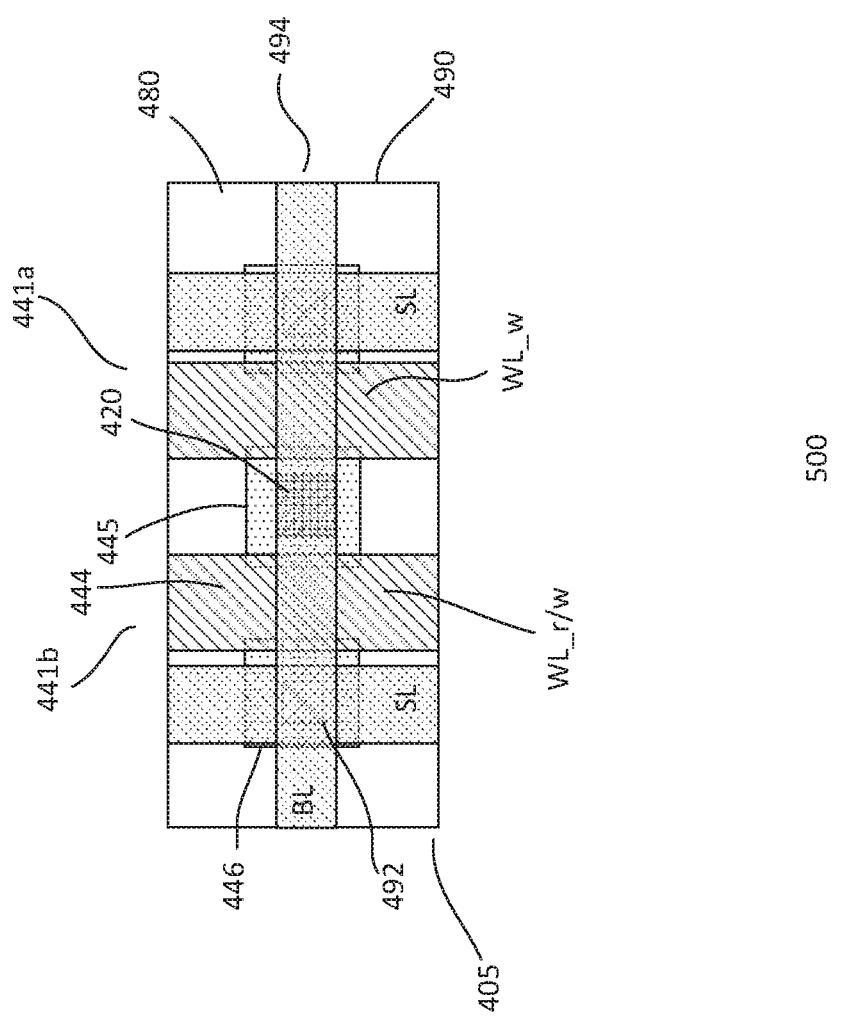
FIGS. 5a-5b show top and cross-sectional views of another embodiment of a memory cell.
Figure 5B:
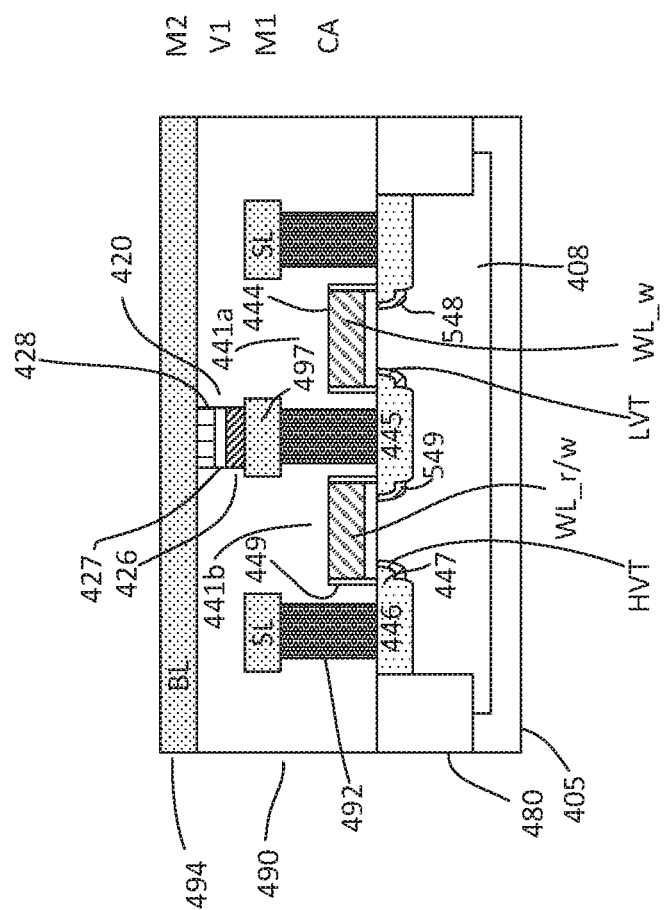

FIGS. 5a-5b show top and cross-sectional views of another embodiment of a device 500. The device, as shown, includes a memory cell. The memory cell, for example, may be a non-volatile memory (NVM) memory cell. The memory cell, in one embodiment, is a magnetoresistive NVM cell, such as a STT-MRAM cell. The memory cell, for example, is similar to that described in FIGS. 2a and 4a-4b. Common elements may not be described or described in detail. In the interest of brevity, the description of the device 500 below primarily focuses on the difference(s) compared with the device 400 described and shown in FIGS. 4a-4b.

As shown, the memory cell includes a cell selector unit with first and second selectors 441a-441b, such as first and second MOS transistors. In one embodiment, the MOS transistors are n-type MOS transistors. Other types of cell selectors may also be useful. The first selector 441a, for example, may be a write selector and the second selector 441b is a read/write selector. In one embodiment, the first transistor 441a is a LVT transistor while the second transistor 441b is a HVT or RVT transistor. In one embodiment, the halo regions of the first and second transistors may be tuned to include different dopant concentrations to produce the desired HVT or RVT and LVT transistors. For example, the halo regions 549 of the second transistor includes a higher second polarity type dopant concentrations relative to the halo regions 548 of the first select transistor. For example, the halo regions 549 includes a dopant concentration of greater than $2E18$ $cm^{-3}$ to form a HVT transistor or a dopant concentration of about $1\text{-}2E18$ $cm^{-3}$ to form a RVT transistor while the halo regions 548 includes a dopant concentration of less than 1E18 cm$^{-3}$ to form a LVT transistor. The dopant concentration, for example, is in increasing order from LVT to RVT to HVT. The dopant concentration values as presented are exemplary and may change depending on, for example, technology node. As described, the different dopant concentrations of the halo regions may be tuned to produce the desired HVT or RVT and LVT transistors. In another embodiment, different surface threshold voltage Vt implant in the substrate may be tuned to form the desired HVT or RVT and LVT transistors.

Further, as shown, the bodies of the transistors are not back biased. For example, no well contacts are provided for biasing the bodies of the transistors. In some embodiments, a well contact may be provided, as shown in FIGS. 4a-4b, to bias the bodies of the transistors. In such case, the read current could be further reduced by reverse back-biasing the bodies of the transistors while the write current could be further increased by forward biasing the bodies of the transistors. In addition, although the first and second selectors are illustrated as n-type transistors, it is understood that the first and second selectors may be p-type transistors.

FIGS. 6a-6m show cross-sectional views of an embodiment of a process 600 for forming a device. The process includes forming a memory cell. The memory cell, for example, may be a NVM memory cell. The memory cell, in one embodiment, is a magnetoresistive NVM cell, such as a STT-MRAM cell. The memory cell, for example, is the same or similar to that described in FIGS. 4a-4b. Common elements may not be described or described in detail.

The cross-sectional views, for example, are along the bit line direction. Although the cross-sectional views show one memory cell, it is understood that the device includes a plurality of memory cells of, for example, a memory array. In one embodiment, the process of forming the STT-MRAM cell is highly compatible with CMOS logic process. For example, the STT-MRAM cell can be formed simultaneously with CMOS logic devices (not shown) on the same substrate.

Figure 6A:
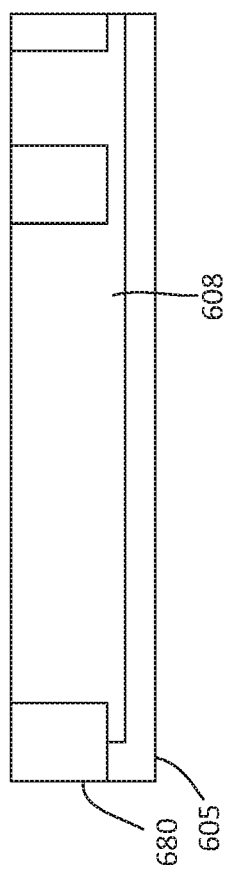

Referring to FIG. 6a, a substrate 605 is provided. The substrate, for example, is a semiconductor substrate, such as a silicon substrate. For example, the substrate may be a lightly doped p-type substrate. Providing an intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, includes silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

In FIG. 6a, the substrate is processed to define a cell region in which a memory cell is formed. The cell region may be part of an array region. For example, the array region may include a plurality of cell regions. The substrate may include other types of device regions, such as a logic region. Other types of regions may also be provided.

Isolation regions 680 are formed in the substrate. In one embodiment, the isolation regions are shallow trench isolation (STI) regions. Other types of isolation regions may also be useful. The isolation regions are provided to isolate device regions from other regions. The isolation regions may also isolate contact regions within a cell region. Isolation regions may be formed by, for example, etching trenches in the substrate and filling them with a dielectric material, such as silicon oxide. A planarization process, such as chemical mechanical polishing (CMP), is performed to remove excess dielectric material, leaving, for example, STI regions isolating the device regions.

Referring to FIG. 6a, a doped well or device well 608 is formed. The well, for example, serves as body of select transistors of the memory cell. In one embodiment, second polarity type dopants are implanted into the substrate to form the doped well. The second polarity type dopants, for example, include p-type dopants. In one embodiment, an implant mask may be employed to implant the dopants to form the doped well. The implant mask, for example, is a patterned photoresist layer. The implant mask exposes regions of the substrate in which the second polarity wells are formed. The device well may be lightly or intermediately doped with second polarity type dopants. For example, the device well may have a dopant concentration of about 1E16 to 1E19/cm$^3$. Other dopant concentrations may also be useful.

Figure 6B:
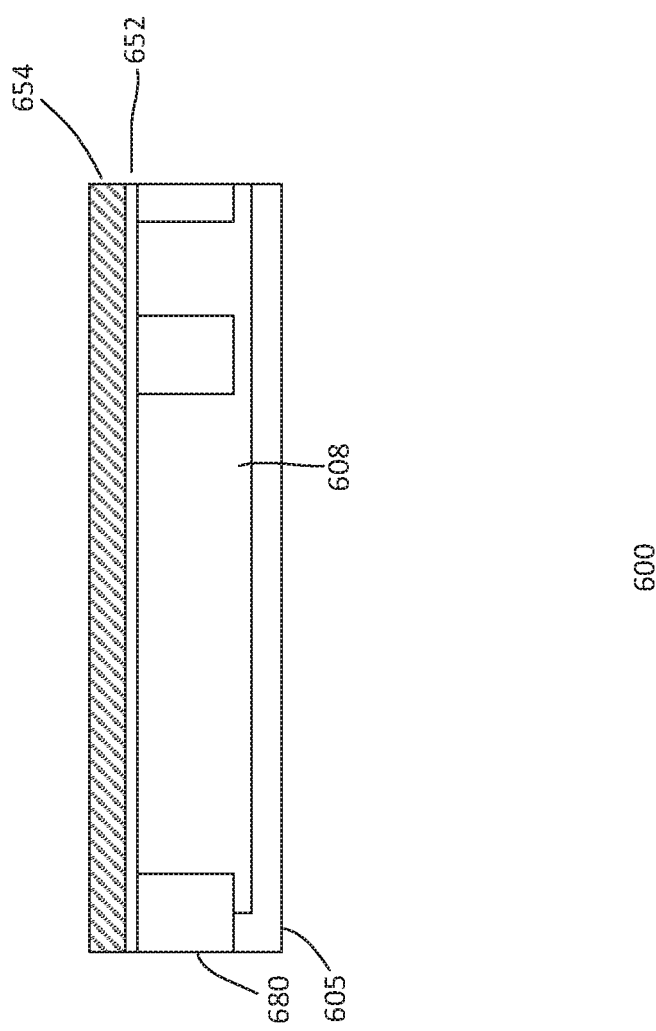

As shown in FIG. 6b, gate layers are formed on the substrate. The gate layers, in one embodiment, include a gate dielectric layer 652 and a gate electrode layer 654 thereover. The gate dielectric layer, for example, may be a silicon oxide layer formed by, thermal oxidation. As for the gate electrode layer, it may be a polysilicon layer formed by chemical vapor deposition (CVD). Other suitable types of gate layers, including high k dielectric and metal gate electrode layers, or other suitable techniques for forming gate layers may also be useful.

Figure 6C:
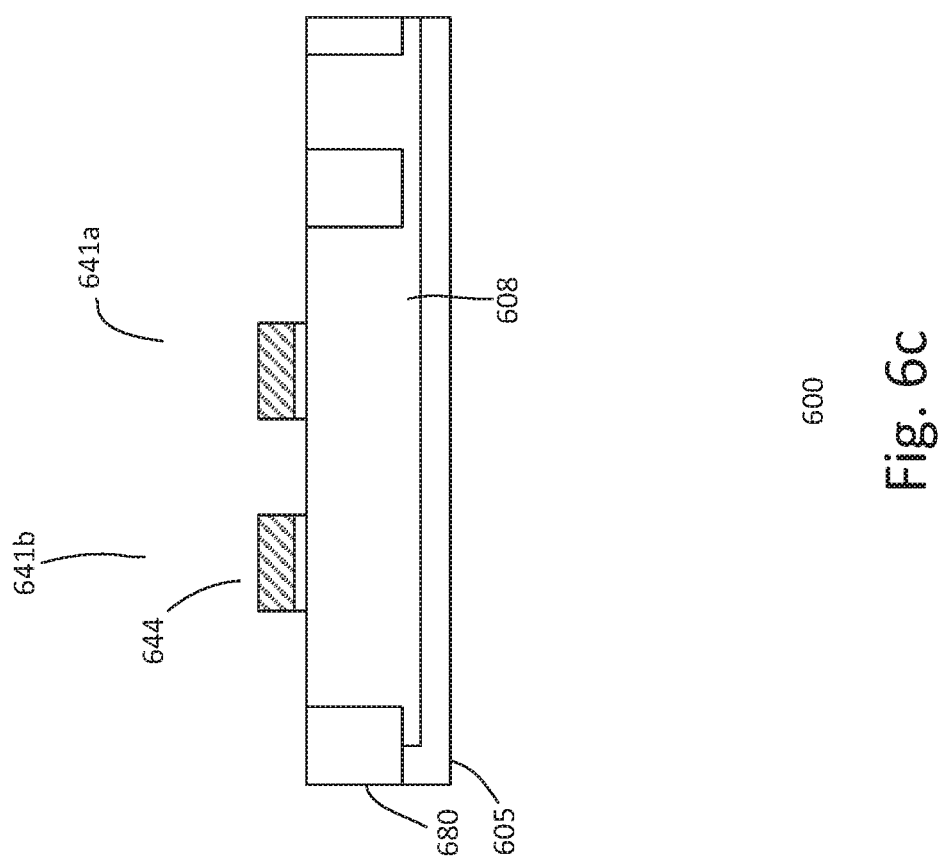

Referring to FIG. 6c, the gate layers are patterned to form gates 644 of the first and second select transistors 641a-641b. Patterning the gate layers may be achieved using mask and etch techniques. For example, a soft mask, such as photoresist may be formed over the gate electrode layer. An exposure source may selectively expose the photoresist layer through a reticle containing the desired pattern. After selectively exposing the photoresist layer, it is developed to form openings corresponding to location where the gate layers are to be removed. To improve lithographic resolution, an anti-reflective coating may be used below the photoresist layer. The patterned mask layer is used to pattern the gate layers. For example, an anisotropic etch, such as reactive ion etch (RIE), is used to remove exposed portions of the gate layers. Other types of etch processes may also be useful. The etch transfers the pattern of the mask layer to the underlying gate layers. Patterning the gate layers forms gates of the select transistors. The gates, for example, may be gate conductors along a first or word line direction. A gate conductor forms a common gate for a row of memory cells. The gate of the first transistor 641a serves as a WL_w while the gate of the second transistor 641b serves as a WL_r/w.

Figure 6D:
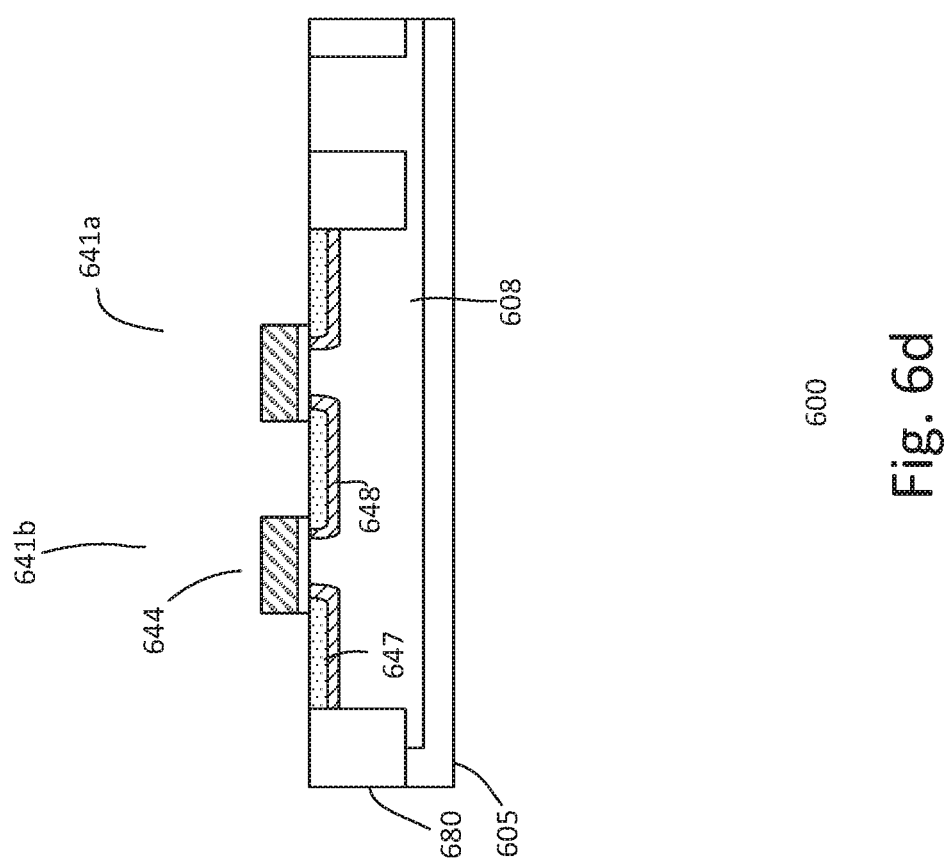

Referring to FIG. 6d, an implant is performed to form LD extension regions 647. An implant mask (not shown) may be used to form the LD extension regions. To form the LD extension regions, first polarity type dopants are implanted into the substrate. The first polarity type dopants, for example, include n-type dopants. In one embodiment, the implant forms LD extension regions in the substrate adjacent to the gates. For example, the LD extension regions extend slightly under the gates. The LD extension regions, for example, include dopant concentration of about 1E18 to 5E19 cm$^{-3}$. Other dopant concentration may also be useful. In one embodiment, the process 600 may also include performing an implant to form halo regions 648. The halo regions are formed by implanting second polarity type dopants into the substrate. The second polarity type dopants, for example, include p-type dopants. The same implant mask to form the LD extension regions may be used to form the halo regions. In one embodiment, the implant forms halo regions in the substrate adjacent to the gates. For example, the halo regions extend slightly under the gates and extend beyond the LD extension regions. The halo regions, for example, have a depth slightly deeper than the LD extension regions. In one embodiment, the halo regions 648, for example, include the same dopant concentration for the first and second select transistors 641a-641b. The halo regions, for example, include dopant concentration of about 5E17 to 5E18 cm$^{-3}$. Other dopant concentration may also be useful.

Figure 6E:
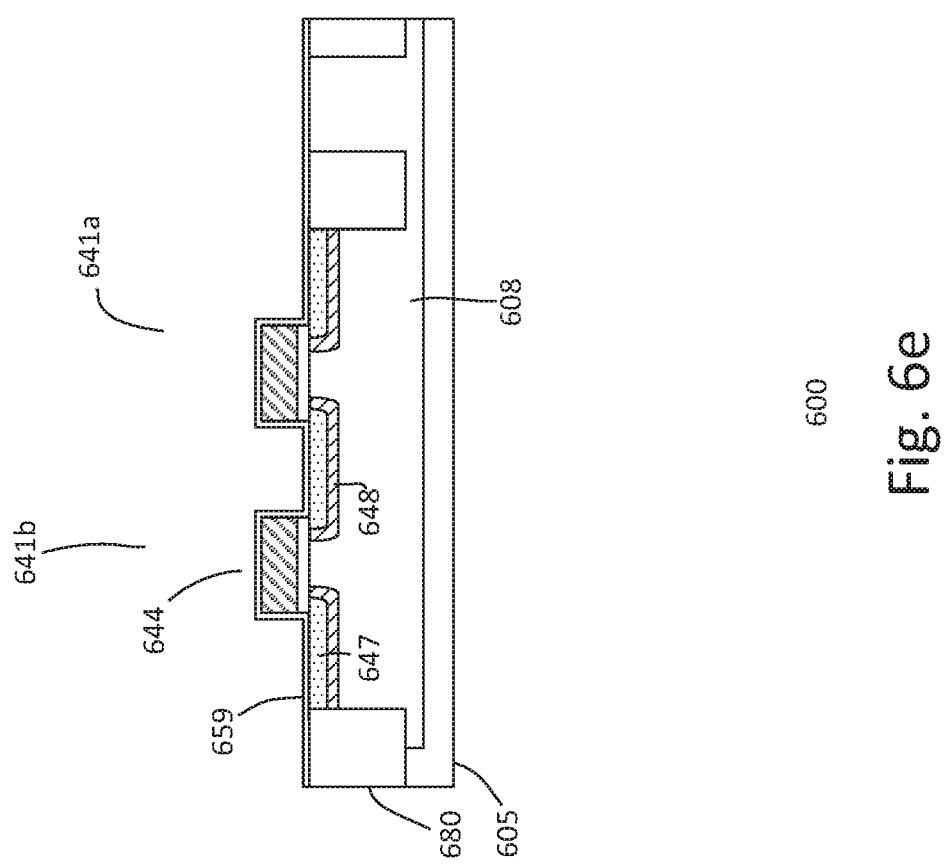

The process 600 continues to form sidewall spacers on sidewalls of the gates 644. To form the spacers, a dielectric spacer layer 659, such as silicon oxide, is formed on the substrate covering the gates as shown in FIG. 6e. The spacer layer may be formed by CVD. Other techniques for forming the spacer layer may also be useful. An anisotropic etch, such as RIE, is performed to remove horizontal portions of the spacer layer, leaving spacers 649 to abut the sidewalls of the gates.

Figure 6F:
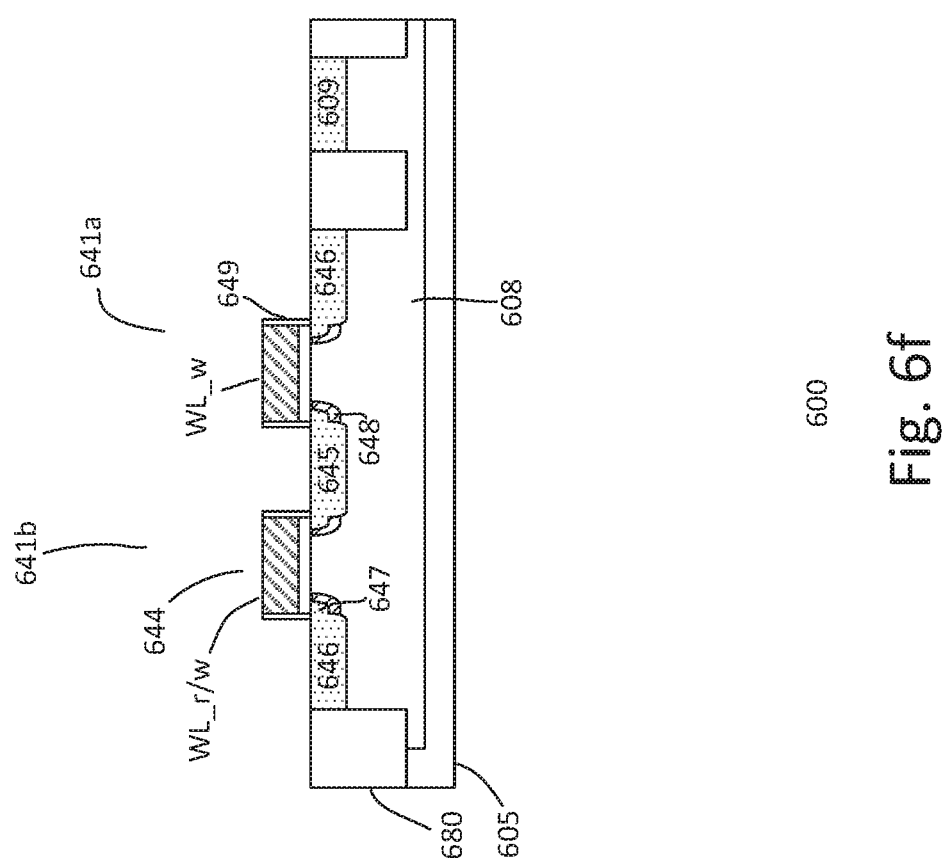

Referring to FIG. 6f, an implant is performed to form first and second S/D regions 645 and 646. An implant mask (not shown) may be used to form the first and second S/D regions in the substrate. In one embodiment, the implant forms heavily doped first polarity type S/D regions in the substrate adjacent to the gates. The first polarity type dopants, for example, include n-type dopants. The implantation process to form the first and second S/D regions may be performed together while forming first polarity type S/D regions in other device regions (not shown) on the same substrate. The first and second heavily doped S/D regions 645 and 646, for example, have a depth deeper than the LD extension regions and halo regions. The first and second S/D regions 645 and 646, for example, include dopant concentration of about 5E19 to 1E21 cm$^{-3}$. Other dopant concentration may also be useful. The first and second select transistors 641a and 641b, as shown, include a common drain region 645 formed in the substrate in between the gates.

In one embodiment, the process 600 also includes forming a well contact 609 in the well 608. The well contact is a second polarity type heavily doped region. The second polarity type dopants, for example, include p-type dopants. An implant is performed to form the well contact 609. An implant mask (not shown) may be used to form the well contact in the substrate. In one embodiment, the implant forms heavily doped second polarity type well contact region in the substrate adjacent to the isolation regions. The implantation process to form the well contact may be performed together while forming second polarity type S/D regions in other device regions (not shown) on the same substrate. The well contact 609, for example, may have the same depth and dopant concentration as the first and second S/D regions 645 and 646. Other dopant concentration may also be useful. The well contact provides a back bias voltage to the device well to bias the body of the transistors of the selectors.

A dielectric etch stop liner (not shown) may be formed over the transistors 641a-641b. The etch stop liner, for example, is a nitride etch stop liner. Other types of dielectric etch stop liners may also be useful. The etch stop liner serves as an etch stop for subsequent processes, such as contacts formation.

Figure 6G:
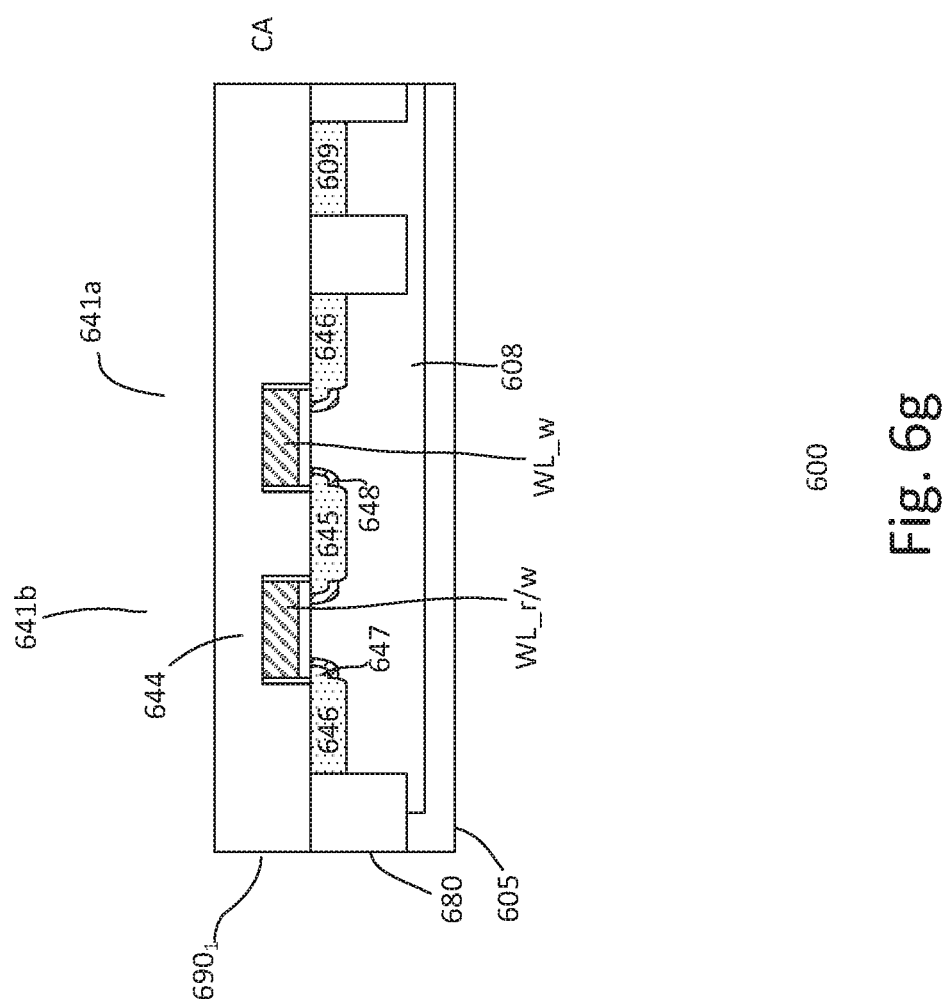

Referring to FIG. 6g, a dielectric layer 690$_1$ is formed on the substrate, covering the transistors. The dielectric layer, for example, serves as a dielectric layer of an ILD layer. For example, the dielectric layer serves as a PMD or CA level of an ILD layer. The dielectric layer, for example, is a silicon oxide layer. Other types of dielectric layers may also be useful. The dielectric layer may be formed by CVD. Other techniques for forming the dielectric layer may also be useful. A planarizing process may be performed to produce a planar surface. The planarizing process, for example, may include CMP. Other types of planarizing processes may also be useful.

Figure 6H:
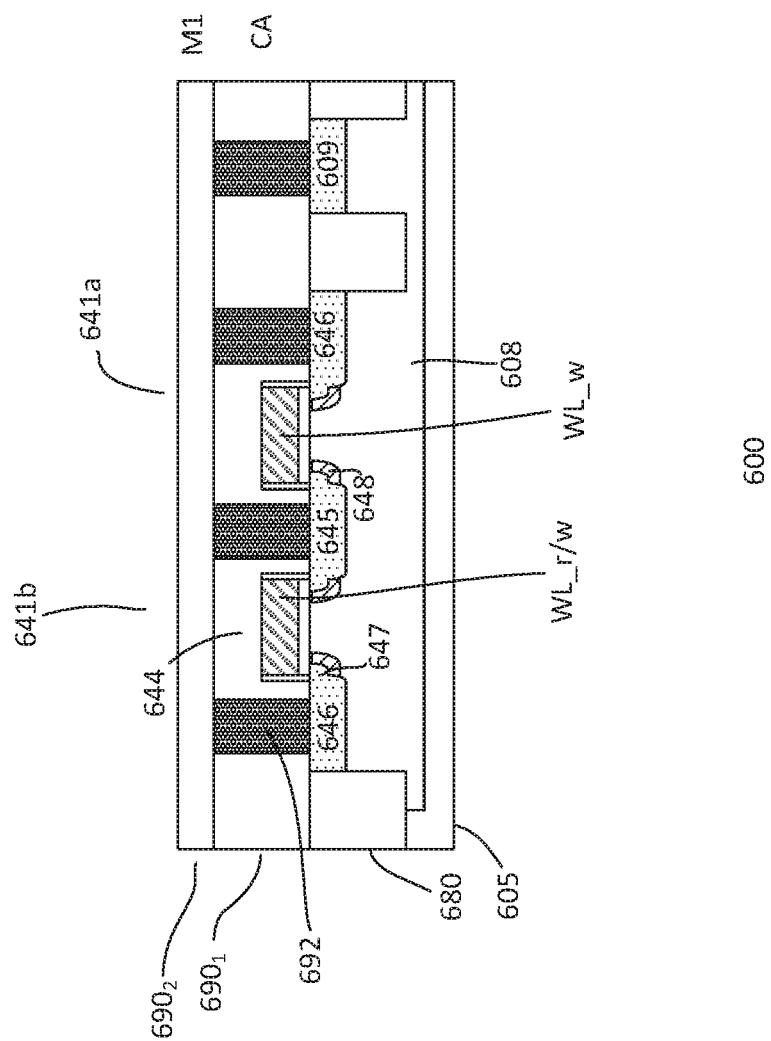
Figure 6I:
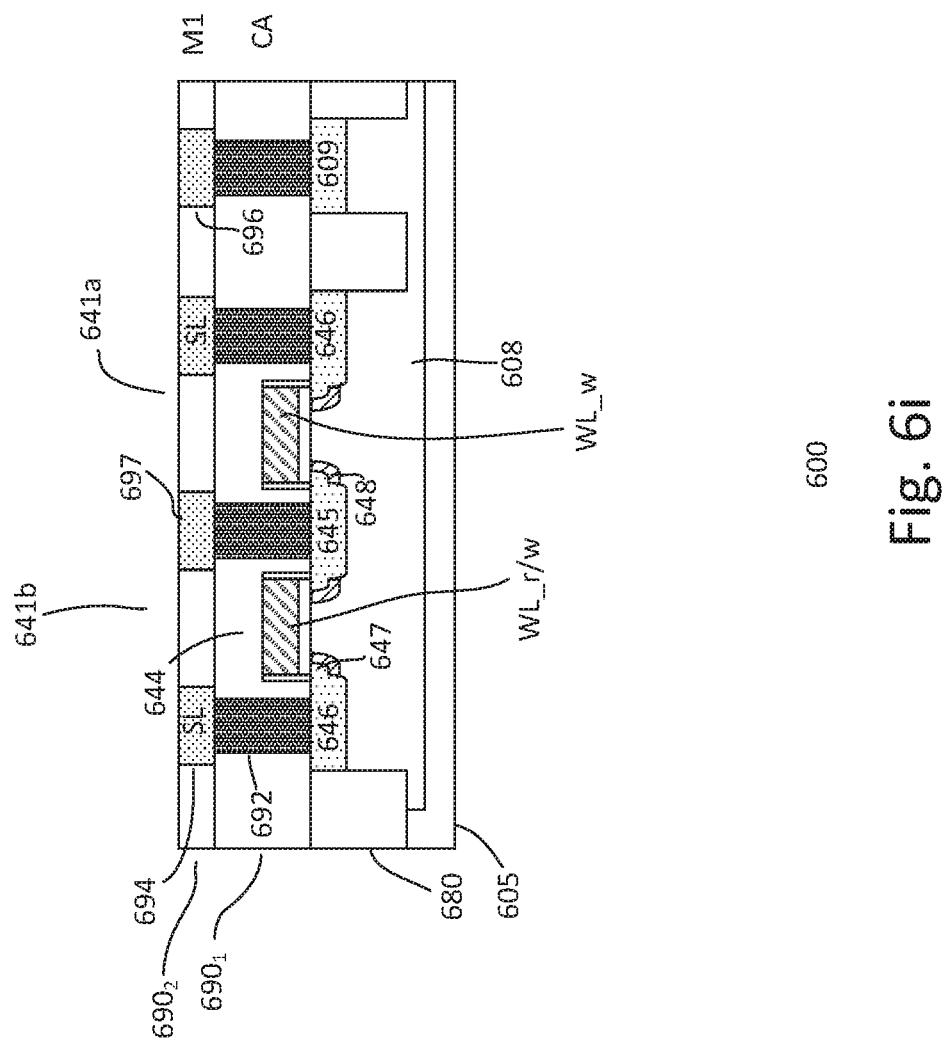

In one embodiment, contacts 692 are formed in the dielectric layer 690$_1$ as shown in FIG. 6h. The contacts, for example, connect to contact regions, such as well contact, S/D regions and gates of the transistors. Forming the contacts may include forming contact vias in the dielectric layer to expose the contact regions. As shown, the contacts 692 are coupled to the well contact 609 and the S/D regions 645 and 646 of the transistors. Forming the contact vias may be achieved using mask and etch techniques. After the vias are formed, a conductive material is deposited to fill the vias. The conductive material, for example, may be tungsten. Other types of conductive materials may also be useful. A planarization process, such as CMP, is performed to remove excess conductive material, leaving contact plugs in the contact vias.

In FIG. 6h, a dielectric layer 690$_2$ is formed over the substrate, covering the lower dielectric layer 690$_1$. The dielectric layer, for example, serves as a metal level of an ILD layer. In one embodiment, the dielectric layer serves as M1 level of the ILD layer. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Conductive or metal lines 694 are formed in the dielectric layer 690$_2$. The conductive lines may be formed by damascene technique. For example, the upper dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. In one embodiment, source lines SLs are formed to connect to the source regions 646 of the transistors while other interconnects, such as interconnect pad 696 formed in M1 is coupled to the well contact 609 and a storage interconnect pad 697 formed in M1 is coupled to the common drain region 645 of the transistors.

Figure 6J:
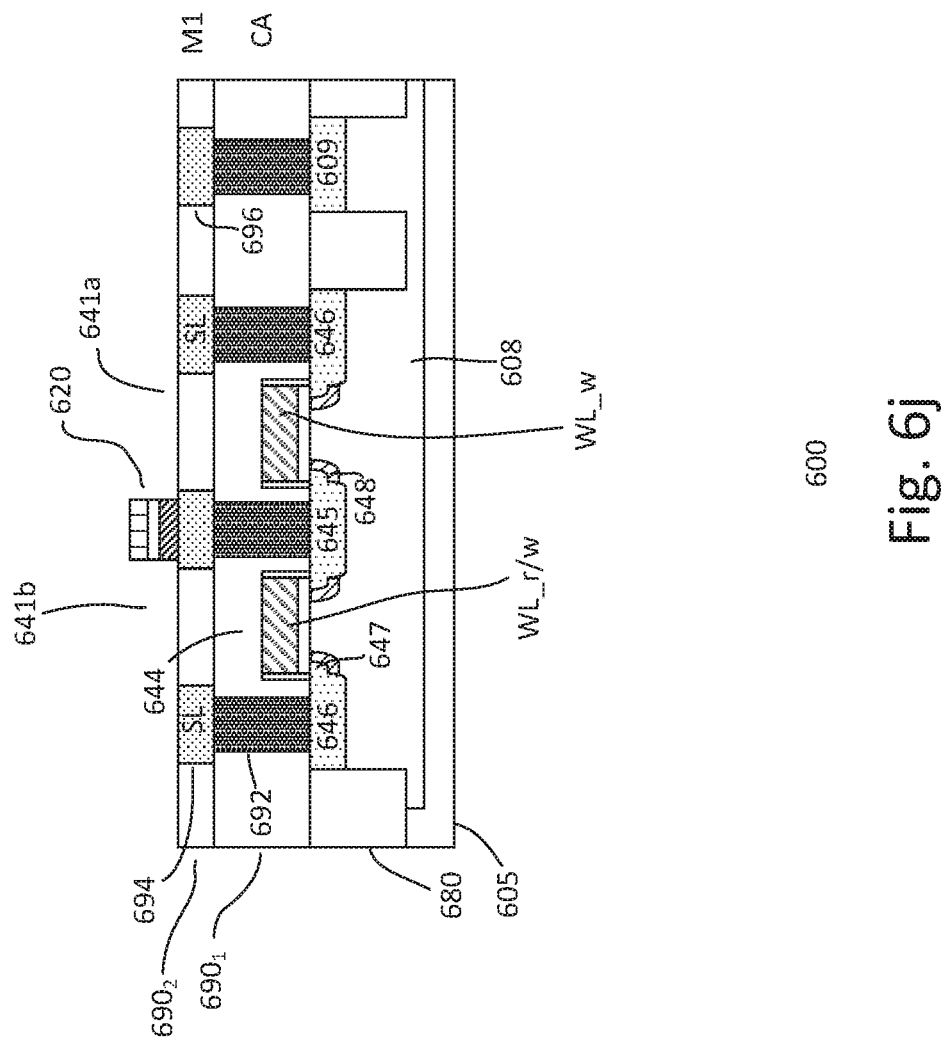

As shown in FIG. 6j, the process continues to form storage element 620 of the memory cell. In one embodiment, the process forms an MTJ element of the memory cells. For example, various layers of MTJ stack are formed on the dielectric layer and patterned to form the MTJ element of the memory cell. Forming the storage elements may include forming the various layers of the MTJ stack on the dielectric layer 690$_2$. The layers may include materials as described in FIGS. 1a-1b and may be formed by various deposition techniques. The deposition techniques may depend on the type of layer. The layers may be patterned to form the MTJ element. Patterning the layers may be achieved using an anisotropic etch, such as RIE, with a patterned mask layer. Other techniques for forming the MTJ element may also be useful.

Figure 6K:
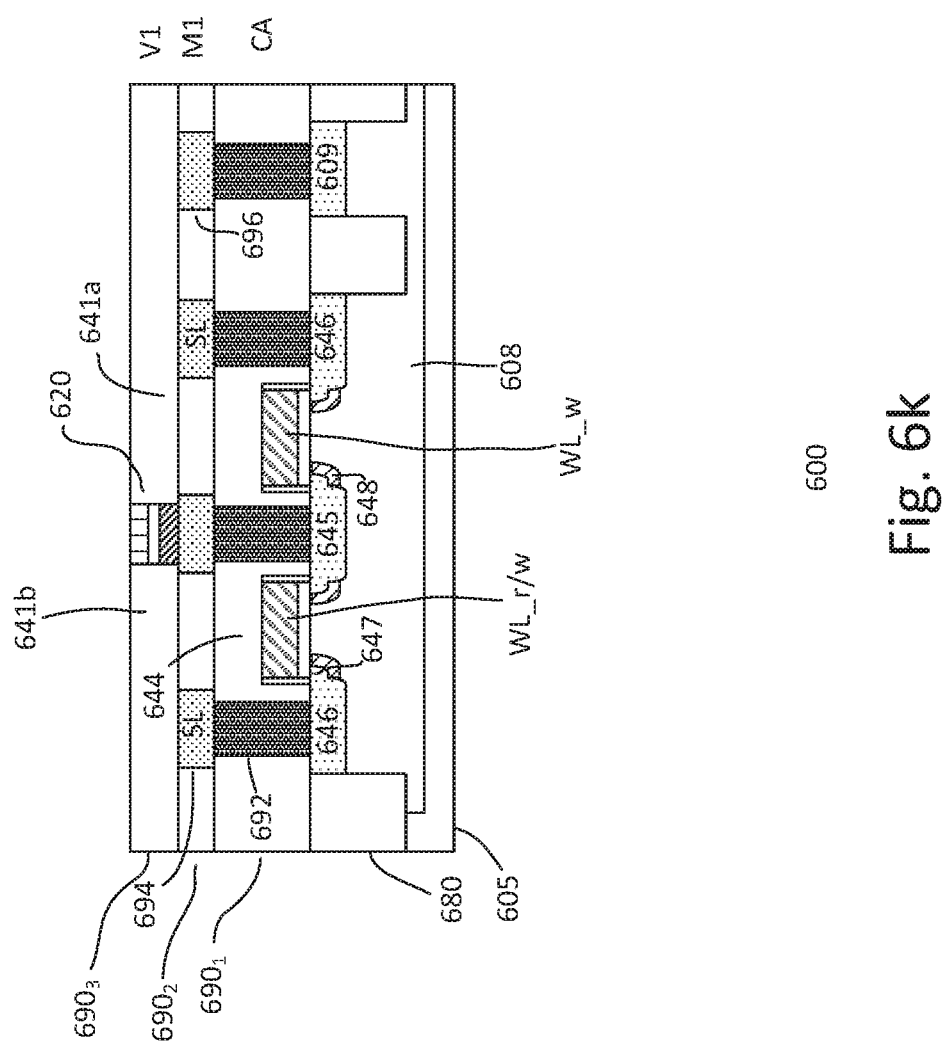
Figure 61:
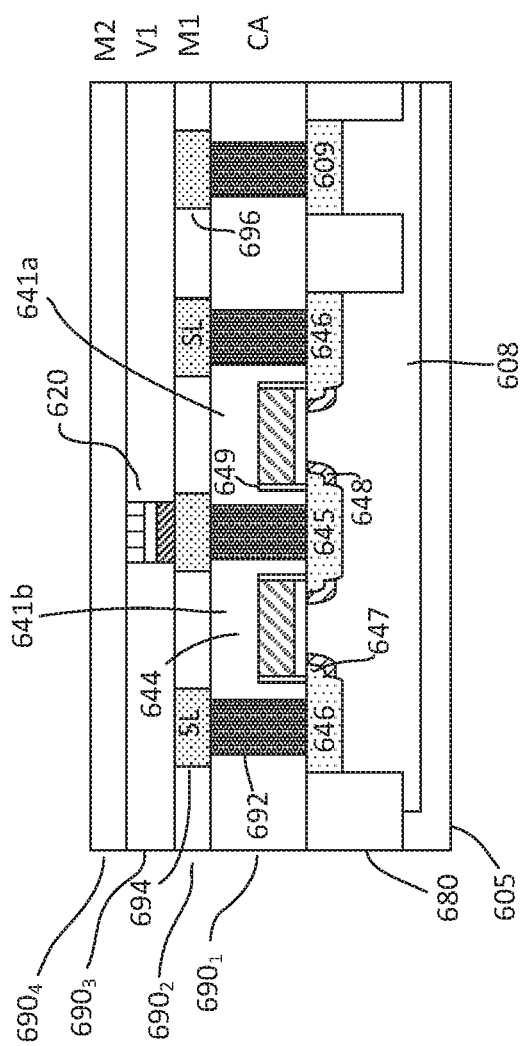

Referring to FIG. 6k, a storage dielectric layer $690_3$ is formed over the MTJ element. The dielectric layer covers the storage element 620. The storage dielectric layer, for example, is a silicon oxide layer. The storage dielectric layer may be formed by, for example, CVD. Other types of storage dielectric layers or forming techniques may also be useful. A planarization process is performed to remove excess dielectric material to form a planar surface. The planarization process, for example, is CMP. The planarization process exposes the top of the storage element and provides a planar surface.

In FIG. 6l, a dielectric layer $690_4$ is formed over the substrate, covering the storage dielectric layer. The dielectric layer, for example, serves as a metal level of an ILD layer. In one embodiment, the dielectric layer serves as a metal level of the storage dielectric level. For example, the dielectric layer serves as M2 while the storage dielectric layer serves as V1. Other ILD levels may also be useful. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed to produce a planar surface.

Figure 6M:
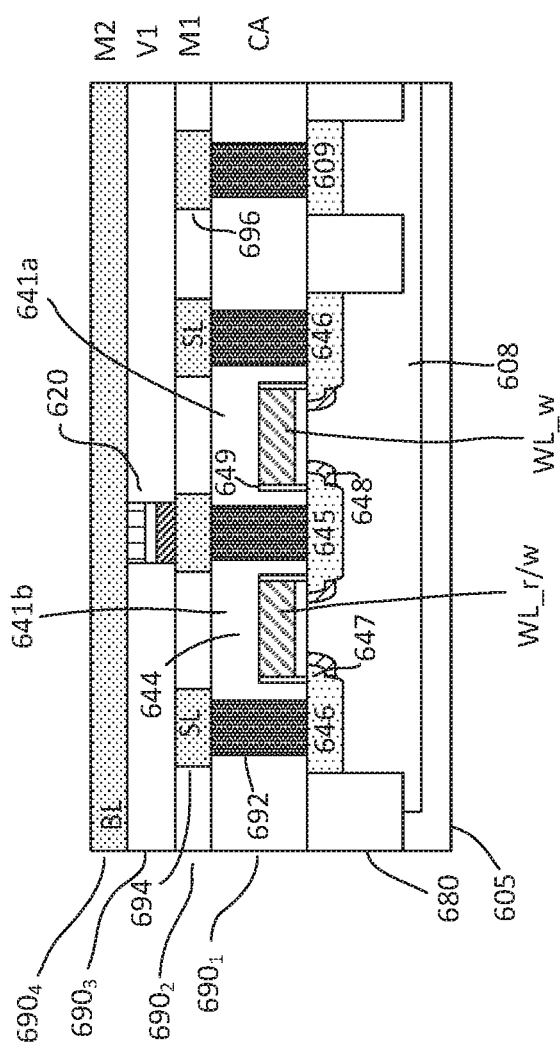

As shown in FIG. 6m, a conductive or metal line is formed in the dielectric layer $690_4$ and on the storage dielectric layer $690_3$. The metal line may be formed using, for example, damascene technique. For example, BL may be formed in the dielectric layer $690_4$. This provides a connection for the storage element to BL. For example, the MTJ element 620 is coupled to the BL.

Additional processes may be performed to complete forming the device. For example, the processes may include forming additional ILD levels, pad level, passivation level, pad opening, dicing, assembly and testing. Other types of processes may also be performed.

Further, the substrate 605 as illustrated in process 600 is a bulk substrate. In other embodiments, the process may be modified to provide a fully depleted silicon-on-insulator (FDSOI) substrate. The SOI substrate includes a surface crystalline layer separated from a bulk crystalline by a buried oxide (BOX) layer. In such case, the process may be modified by performing a hybrid process to remove portions of the surface crystalline and BOX layer so that a body contact can be formed to connect to the N-type region of the bulk crystalline for back-biasing.

FIGS. 7a-7d show cross-sectional views of another embodiment of a process 700 for forming a device. The process includes forming a memory cell. The memory cell, for example, is the same or similar to that described in FIGS. 5a-5b and the process 700 is similar to process 600 as described in FIG. 6a-6m. Thus, common elements may not be described or described in detail. In the interest of brevity, the description of the process 700 below primarily focuses on the difference(s) compared with the process 600 described and shown in FIGS. 6a-6m.

As shown in FIG. 7a, a partially processed substrate is provided. The substrate is processed at the stage similar to that described in FIG. 6c. For example, gates 644 of the first and second transistors 641a-641b are formed on the substrate.

Figure 7B:
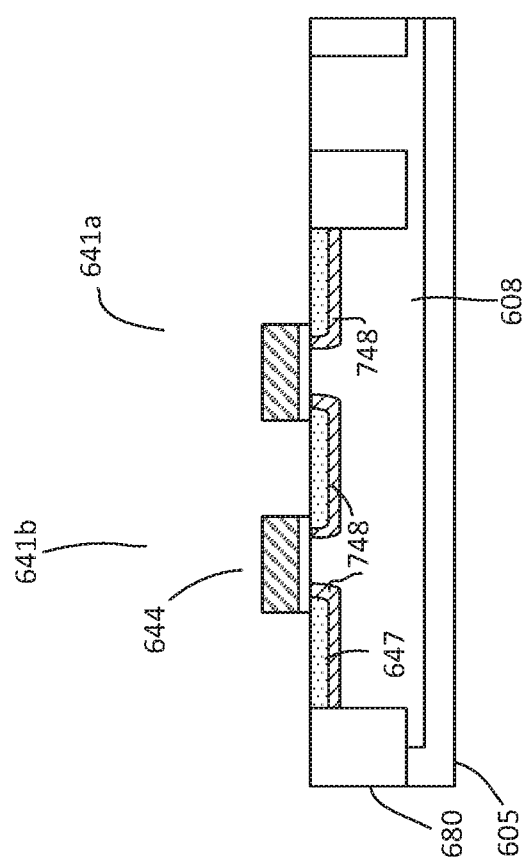
Figure 7C:
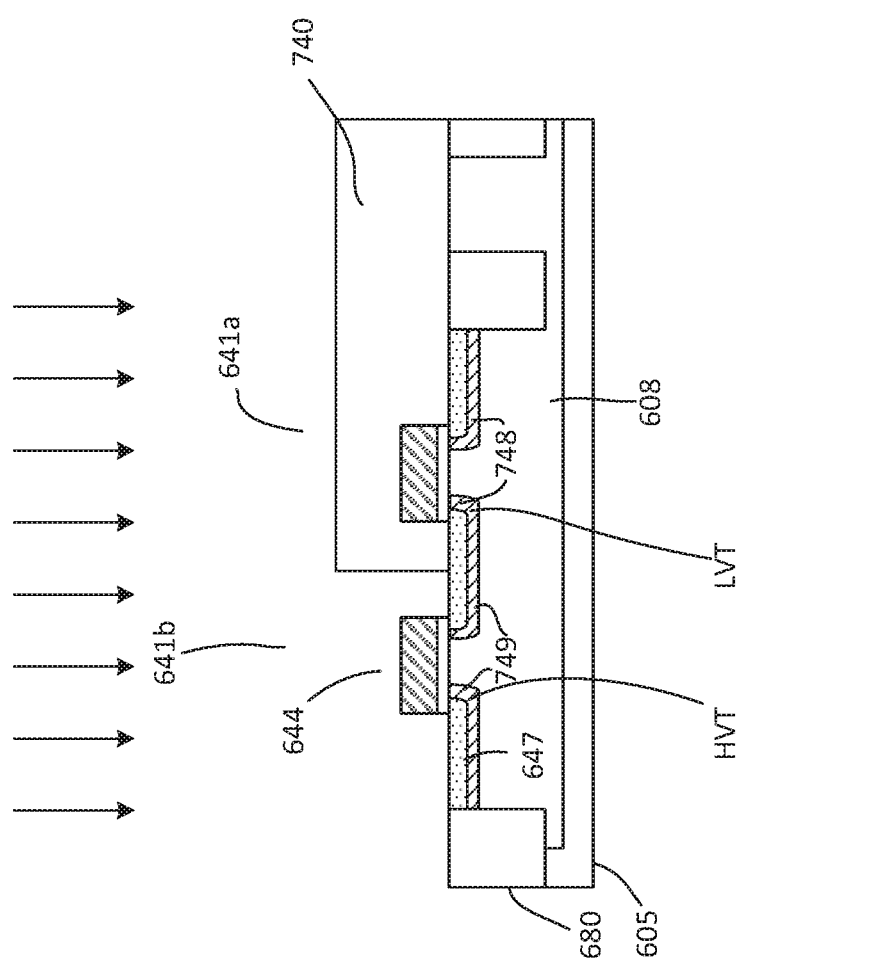

Referring to FIG. 7b, an implant is performed to form LD extension regions 647. The process parameters for forming the LD extension regions are the same as that described in FIG. 6d. In one embodiment, the process 700 also forms halo regions in the substrate. In one embodiment, a first halo implant is performed by implanting second polarity type dopants into the substrate. The second polarity type dopants, for example, include p-type dopants. The same implant mask (not shown) to form the LD extension regions may be used to form the halo regions. In one embodiment, the implant forms halo regions 748 in the substrate adjacent to the gates of the first and second transistors. For example, the halo regions extend slightly under the gates and extend beyond the LD extension regions. The halo regions, for example, have a depth slightly deeper than the LD extension regions. In one embodiment, the first halo implant, for example, is performed at an angle of 15-45 degrees with reference to the substrate surface and include a dopant concentration of greater than 2E18 cm$^{-3}$. Other suitable angles and dopant concentrations may also be useful. The implant mask is removed, for example, by ashing.

The process 700 continues by providing another implant mask 740. The implant mask, in one embodiment, covers a portion of the substrate where the first transistor 641a is disposed, while a portion of the substrate where the second transistor 641b is disposed is exposed. For example, the implant mask 740 covers the gate 644 of the first transistor 641a and portions of the LD extension regions of the first transistor 641a, while the gate 644 of the second transistor 641b and portions of the LD extension regions of the second transistor 641b are exposed. A second halo implant is performed by implanting second polarity type dopants into exposed portions of the substrate. The second polarity type dopants, for example, include p-type dopants. In one embodiment, the second halo implant introduces second polarity type dopants into exposed portions of the substrate adjacent to the gate of the second transistor. In one embodiment, the second halo implant, for example, is performed at an angle of 15-45 degrees with reference to the substrate surface and include a dopant concentration of about 1E17 to 2E18 cm$^{-3}$. Other suitable angles and dopant concentrations may also be useful. The implant mask 740 is removed, for example, by ashing.

The dopant concentration in the halo regions affect the threshold voltage of the transistors. As shown, the halo regions 749 formed in exposed portions of the substrate adjacent to the gate of the second transistor 641b include a dopant concentration that is introduced by both the first and second halo implants and is higher than that of the halo regions 748 formed in portions of the substrate adjacent to the gate of the first transistor 641b. The combination of the first and second halo implants produces a high threshold voltage (HVT). Thus, the second transistor 641b is a HVT transistor while the first transistor 641a which is subject to the first halo implant is a low threshold voltage (LVT) transistor.

As described, the different dopant concentrations of the halo regions may be tuned to produce the desired HVT or RVT and LVT transistors. In another embodiment, different surface threshold voltage Vt implant may be tuned to form the desired HVT or RVT and LVT transistors.

Figure 7D:
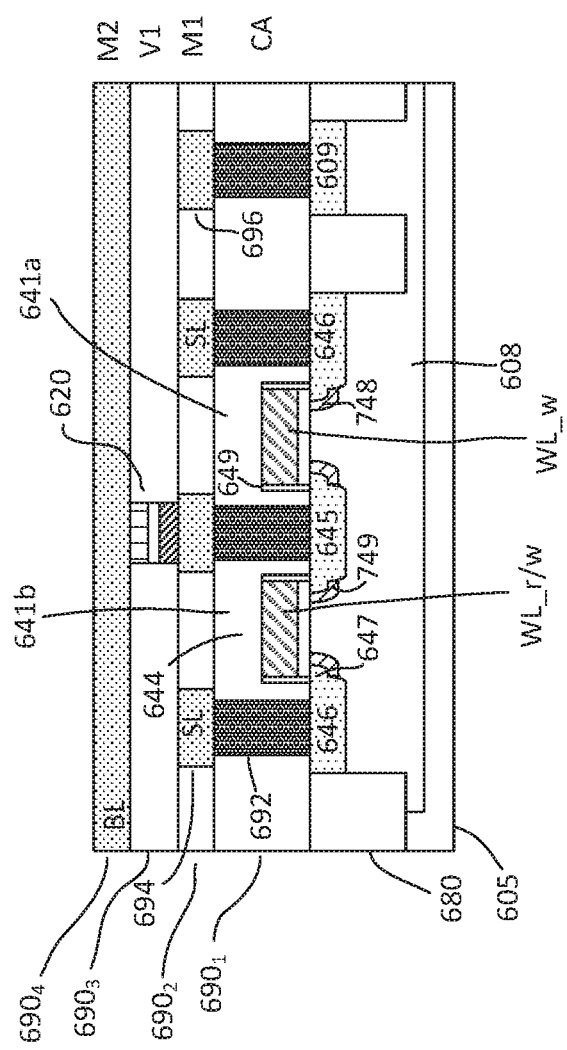

The process continues with processing steps as described in FIG. 6e and onwards. For example, the process continues to form sidewall spacers, heavily doped S/D regions, forming dielectric layers, via contacts, metal lines, storage elements, etc. Additional processing is performed on the substrate until a device such as that shown in FIG. 7d is formed. Details of these processing steps are the same as that described in FIGS. 6e-6m and therefore will not be described or described in detail.

The embodiments as described result in various advantages. The embodiments as described above improves read stability while achieving optimal write robustness of the memory cell. For example, the memory cell with the reversed back biased improves read margin and two WLs are utilized during write operation provides for high write current. In addition, providing a low threshold for the write transistor and a high threshold for the read transistor improves writing speed of the write transistor. The processes as described are also highly compatible with CMOS logic processing and could be implemented using current technology and equipment. Thus, no additional cost is required for implementing the processes as described above.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory cell comprising:
a substrate defined with a memory cell region;
a cell selector unit disposed on the substrate, wherein the cell selector unit comprises
a first select transistor having a first gate coupled to a first word line (WL) and first and second source/drain (S/D) regions, and
a second select transistor having a second gate coupled to a second WL and first and second S/D regions, wherein
the first select transistor serves as a write selector and the second select transistor serves as a read selector,
the first select transistor is configured as a low threshold voltage (LVT) transistor and the second select transistor is configured as a high threshold voltage (HVT) or regular threshold voltage (RVT) transistor,
the first WL is a write wordline (WL_w) and the second WL is a read/write wordline (WL_r/w), and
the second S/D regions of the first and second select transistors are coupled to a common source line (SL);
a body well disposed in the substrate, wherein the body well serves as a body of the first and second select transistors, wherein a back bias is applied to the body of the select transistors; and
a storage element which comprises a magnetic tunnel junction (MTJ) element coupled with a bitline (BL) and the first and the second select transistors.

2. The memory cell of claim 1 wherein the S/D regions comprise first polarity type dopants and the body well comprises second polarity type dopants, wherein the second polarity type is opposite to the first polarity type.

3. The memory cell of claim 1 wherein the second S/D regions of the first and second select transistors are a common drain region.

4. The memory cell of claim 3 wherein the common drain region of the first and second select transistors are coupled to the MTJ element.

5. The memory cell of claim 1 wherein the first and second select transistors comprise halo regions disposed adjacent to first and second sides of the first and second gates of the select transistors, the halo regions adjacent to the second gate of the second select transistor comprise a higher dopant concentration relative to the halo regions adjacent to the first gate of the first select transistor.

6. The memory cell of claim 1 wherein the halo regions adjacent to the first and second gates of the first and second select transistors are tuned to include different dopant concentrations to produce the HVT or RVT and the LVT transistors.

7. A memory cell comprising:
a substrate defined with a memory cell region;
a cell selector unit disposed on the substrate, wherein the cell selector unit comprises
a first select transistor having a first gate coupled to a first word line (WL) and first and second source/drain (S/D) regions, and
a second select transistor having a second gate coupled to a second WL and first and second S/D regions, wherein
the first select transistor serves as a write selector and the second select transistor serves as a read selector,
the first WL is a write wordline ($WL_{13}w$) and the second WL is a read/write wordline (WL_r/w), and
the second S/D regions of the first and second select transistors are coupled to a source line (SL);
a body well disposed in the substrate, wherein the body well serves as a body of the first and second select transistors, wherein a back bias is applied to the body of the select transistors;
a storage element which comprises a magnetic tunnel junction (MTJ) element coupled with a bitline (BL) and the first and the second select transistors; and
wherein a forward back bias is applied to the body of the select transistors to increase a write current to write the MTJ element and a reverse back bias is applied to the body of the select transistors to reduce a read current to read the MTJ element.

8. The memory cell of claim 7 wherein the forward back bias comprises a positive voltage greater than 0 to 0.6V.

9. The memory cell of claim 7 wherein the reverse back bias comprises a negative voltage less than 0 to −2V.

10. A memory cell comprising:
a substrate defined with a memory cell region;
a cell selector unit disposed on the substrate, wherein the cell selector unit comprises
a first select transistor having a first gate coupled to a first word line (WL) and first and second source/drain (S/D) regions, and
a second select transistor having a second gate coupled to a second WL and first and second S/D regions, wherein
the first select transistor serves as a write selector and the second select transistor serves as a read selector,
the first select transistor is a low threshold voltage (LVT) transistor and the second select transistor is a high threshold voltage (HVT) or regular threshold voltage (RVT) transistor, wherein the first and second select transistors comprise halo regions disposed adjacent to first and second sides of the first and second gates of the select transistors, the S/D regions comprise first polarity type dopants and the halo regions comprise second polarity type dopants, wherein the second polarity type is opposite to the first polarity type, the halo regions adjacent to the second gate of the second select transistor comprise a higher second polarity type dopant concentration relative to the halo regions adjacent to the first gate of the first select transistor, the first WL is a write wordline (WL_w) and the second WL is a read/write wordline (WL_r/w), and the second S/D regions of the first and second select transistors are coupled to a common source line (SL);

a storage element which comprises a magnetic tunnel junction (MTJ) element coupled with a bitline (BL) and the first and the second select transistors; and wherein the HVT or RVT transistor decreases a read current during a read operation to improve stability.

11. The memory cell of claim 10 wherein the halo regions adjacent to the first and second gates of the first and second select transistors are tuned to include different dopant concentrations to produce the HVT or RVT and the LVT transistors.

12. The memory cell of claim 10 wherein different surface threshold voltage Vt implant in the substrate are tuned to form the HVT or RVT and LVT transistors.

13. The memory cell of claim 10 comprising a body well disposed in the substrate, wherein the body well serves as a body of the first and second select transistors, wherein a back bias is applied to the body of the select transistors.

14. The memory cell of claim 10 wherein a forward back bias is applied to the body of the select transistors to increase a write current to write the MTJ element and a reverse back bias is applied to the body of the select transistors to reduce a read current to read the MTJ element.

15. A method of operating a memory cell comprising:
providing a memory cell comprising
a substrate defined with a memory cell region,
a cell selector unit disposed on the substrate, wherein the cell selector unit comprises
a first select transistor having a first gate coupled to a first word line (WL) and first and second source/drain (S/D) regions, and
a second select transistor having a second gate coupled to a second WL and first and second S/D regions, wherein
the first select transistor serves as a write selector and the second select transistor serves as a read selector,
the first select transistor is configured as a low threshold voltage (LVT) transistor and the second select transistor is configured as a high threshold voltage (HVT) or regular threshold voltage (RVT) transistor,
the first WL is a write wordline (WL_w) and the second WL is a read/write wordline (W_r/w), and
the second S/D regions of the first and second select transistors are coupled to a common source line (SL),
a body well disposed in the substrate, wherein the body well serves as a body of the first and second select transistors, wherein a back bias is applied to the body of the select transistors, and
a storage element which comprises a magnetic tunnel junction (MTJ) element coupled with a bitline (BL) and the first and the second select transistors; and performing a read operation or write operation with the memory cell, wherein
when a write operation is performed, the WL_w and the WL_r/w are activated such that a write path is formed through both the first and second select transistors, and
when a read operation is performed, the WL_w is inactive and the WL_r/w is activated such that a read path is formed through the second select transistor.

16. The method of claim 15 wherein a forward back bias is applied to the body of the select transistors to increase a write current to write the MTJ element and a reverse back bias is applied to the body of the select transistors to reduce a read current to read the MTJ element.

17. A method of forming a memory cell comprising:
providing a substrate defined with a memory cell region;
forming a cell selector unit on the substrate, wherein forming the cell selector unit comprises
forming a first select transistor having a first gate coupled to a first word line (WL) and first and second source/drain (S/D) regions, and
forming a second select transistor having a second gate coupled to a second WL and first and second S/D regions, wherein
the first select transistor serves as a write selector and the second select transistor serves as a read selector,
the first WL is a write wordline (WL_w) and the second WL is a read/write wordline (WL_r/w), and
the second S/D regions of the first and second select transistors are coupled to a source line (SL);
forming a body well in the substrate, wherein the body well serves as a body of the first and second select transistors, and applying a back bias to the body of the select transistors, wherein applying the back bias comprises
applying a forward back bias to the body of the select transistors to increase a write current to write the MTJ element, and
applying a reverse back bias to the body of the select transistors to reduce a read current to read the MTJ element; and
forming a storage element which comprises a magnetic tunnel junction (MTJ) element coupled with a bitline (BL) and the first and the second select transistors.

18. The method of claim 17 wherein the forward back bias comprises a positive voltage greater than 0 to 0.6V and the reverse back bias comprises a negative voltage less than 0 to −2V.

19. The method of claim 17 wherein the first select transistor is configured as a low threshold voltage (LVT) transistor and the second select transistor is configured as a high threshold voltage (HVT) or regular threshold voltage (RVT) transistor.

20. The method of claim 17 wherein the first and second select transistors comprise halo regions disposed adjacent to first and second sides of the first and second gates of the select transistors, the halo regions adjacent to the second gate of the second select transistor comprise a higher dopant concentration relative to the halo regions adjacent to the first gate of the first select transistor.

* * * * *